(12) United States Patent
Yang et al.

(10) Patent No.: US 11,929,360 B2
(45) Date of Patent: *Mar. 12, 2024

(54) POWER CELL FOR SEMICONDUCTOR DEVICES

(71) Applicant: TAIWAN SEMICONDUCTOR MANUFACTURING COMPANY, LTD., Hsinchu (TW)

(72) Inventors: Chung-Chieh Yang, Hsinchu (TW); Chung-Ting Lu, Hsinchu (TW); Yung-Chow Peng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/864,365

(22) Filed: Jul. 13, 2022

(65) Prior Publication Data
US 2022/0352143 A1    Nov. 3, 2022

Related U.S. Application Data

(63) Continuation of application No. 17/075,968, filed on Oct. 21, 2020, now Pat. No. 11,410,986.

(51) Int. Cl.
*H01L 27/02* (2006.01)
*H01L 21/768* (2006.01)
*H01L 21/8238* (2006.01)
*H01L 23/522* (2006.01)

(52) U.S. Cl.
CPC .... *H01L 27/0207* (2013.01); *H01L 21/76885* (2013.01); *H01L 21/823871* (2013.01); *H01L 23/5226* (2013.01)

(58) Field of Classification Search
CPC .......... H01L 27/0207; H01L 21/76885; H01L 21/823871; H01L 23/5226
USPC ....................................................... 257/528
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 9,921,640 B2 | 3/2018 | Zillmann et al. | |
| 11,410,986 B2 * | 8/2022 | Yang | H01L 27/092 |
| 2014/0040838 A1 | 2/2014 | Liu et al. | |
| 2015/0278429 A1 | 10/2015 | Chang | |

* cited by examiner

*Primary Examiner* — Tu-Tu V Ho
(74) *Attorney, Agent, or Firm* — Hauptman Ham, LLP

(57) ABSTRACT

A device includes an electrical circuit having a first set of circuit elements. The device further includes a first set of conductive pillars over a first side of a substrate. The device further includes a first conductive rail electrically connected to each of the first set of conductive pillars, wherein each of the first set of conductive pillars is electrically connected to each of the first set of circuit elements by the first conductive rail. The device further includes a first plurality of power pillars extending through the substrate, wherein each of the first plurality of power pillars is electrically connected to the first conductive rail.

20 Claims, 18 Drawing Sheets

POWER CELL FOR SEMICONDUCTOR DEVICES

RELATED APPLICATIONS

This application is a continuation of U.S. patent application Ser. No. 17/075,968, filed Oct. 21, 2020, now U.S. Pat. No. 11,410,986, issued on Aug. 9, 2022, which is herein incorporated in its entirety.

BACKGROUND

In a semiconductor device, a timing circuit regulates the operation of transistors and other circuit elements by, e.g., ensuring that the devices receive and send data synchronously. Circuit matching of transistors improves the timing of semiconductor device performance.

Modifying the timing of transistors at the transistor level is difficult to achieve because the transistor channel length and other transistor features are difficult to change without having significant impacts to resistance. Small changes in channel length, or in the dimensions of the transistor, are likely to have outsized influence on transistor performance.

DETAILED DESCRIPTION

Figure 1:
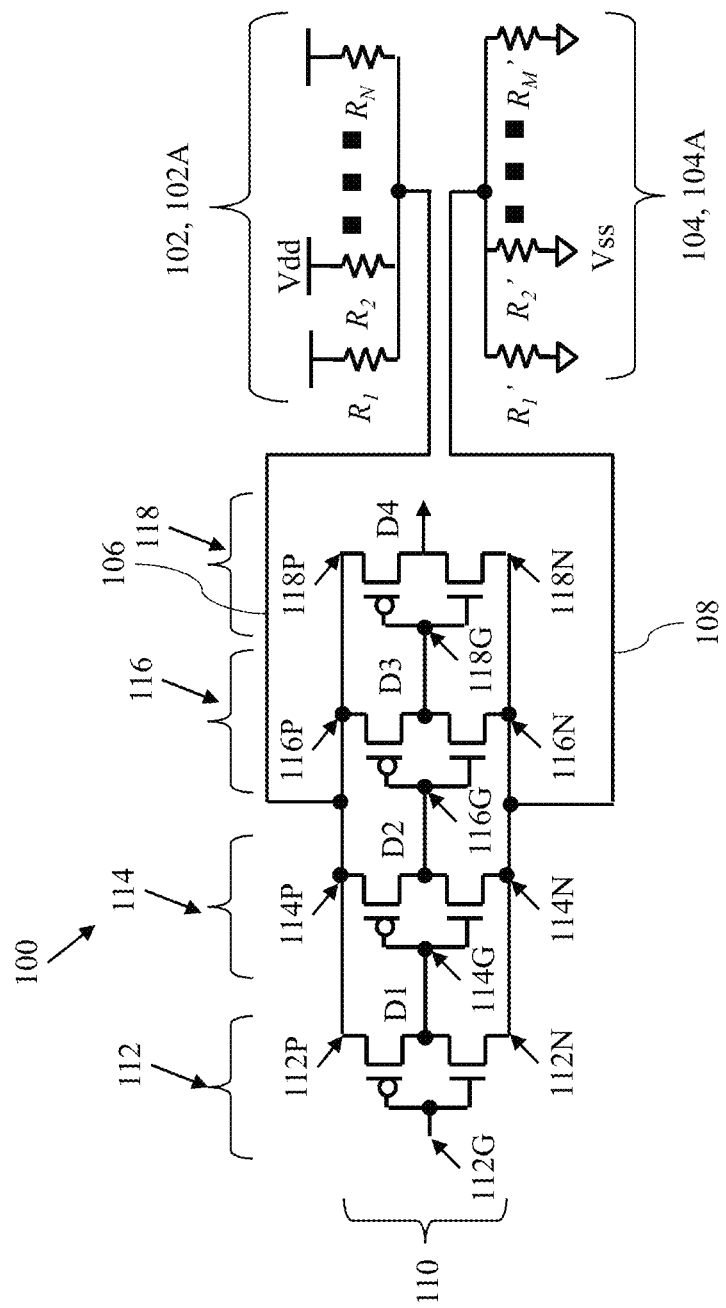
FIG. 1 is a diagram of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices which have individual power delivery pillars to transistors (or other circuit elements) in an active area of the semiconductor device are associated with small circuit layout areas. However, individual power delivery pillars between bottom-side power delivery rails and circuit elements are associated with higher overall resistance and elevated risks of device failure should a single power delivery pillar to a transistor suffer from a manufacturing defect. By arranging individual power delivery pillars into groups, or power cells, where the power delivery pillars are connected in parallel to topside and/or bottom-side power delivery rails, the overall resistance of the power delivery rails is decreased. Further, circuit matching becomes easier because resistance (and therefore circuit timing) is adjustable for groups of transistors or other circuit elements. Circuit matching includes an operation of determining a number of power delivery pillars in power cells for connecting to a voltage source, or connecting to ground. Different groups of transistors or circuit elements at different locations in a semiconductor device are circuit matched by, inter alia, modeling the circuit performance for a first semiconductor device layout, modifying the number of power cells or power pillars connecting to the transistors or circuit elements, and repeating the circuit performance modeling to achieve circuit matching within a matching specification for the semiconductor device.

FIG. 1 is a diagram of a semiconductor device 100, in accordance with some embodiments. The semiconductor device 100 includes an inverter chain 110 including four inverters: inverter 112, inverter 114, inverter 116, and inverter 118. The inverters 112, 114, 116, and 118 of inverter chain 110 are electrically connected in parallel to a conductive rail 106 (or to a first terminal of inverter chain 110), and to a conductive rail 108 (or to a second terminal of inverter chain 110). Inverter 112 includes P-type transistor 112P and N-type transistor 112N which share a common gate electrode line, gate electrode line 112G, and a common drain D1. Inverter 114 includes P-type transistor 114P and N-type transistor 114N which share a common gate electrode line, gate electrode line 114G, and a common drain D2. Inverter 116 includes P-type transistor 116P and N-type transistor 116N which share a common gate electrode line, gate electrode line 116G, and a common drain D3. Inverter 118 includes P-type transistor 118P and N-type transistor 118N which share a common gate electrode line, gate electrode line 118G, and a common drain D4. Common drain D1 electrically connects to gate electrode line 114G. Common drain D2 electrically connects to gate electrode line 116G. Common drain D3 electrically connects to gate electrode line 118G.

In inverter chain 110, the sources of the P-type transistors are electrically connected in parallel to conductive rail 106. Conductive rail 106 is electrically connected to a supply voltage (Vdd). In inverter chain 110, the sources of the N-type transistors are electrically connected in parallel to conductive rail 108. Conductive rail 108 is electrically connected to a ground (Vss).

Conductive rail 106 is electrically connected to a power cell 102A which includes a first set of power pillars 102 having N power pillars therein. Conductive rail 108 is electrically connected to a power cell 104A which includes a second set of power pillars 104 having M power pillars therein. In a semiconductor device, a power pillar is a column or stack of electrically conductive material which extends down from a topside conductive rail to a substrate, through the substrate, and below the bottom of the substrate down to a second conductive rail which connects to a supply voltage or ground. In power cell 102A, the supply voltage electrically connects to conductive rail 106. In power cell 104A, the ground electrically connects to conductive rail 108. Conductive rails 106 and 108 are topside conductive rails, which electrically connect a power cell to a circuit element (e.g., the sources of the transistors 112N, 112P, 114N, 114P, 116N, 116P, 118N, and 118P).

Each power pillar of the first set of power pillars 102 (e.g., in power cell 102A) has a resistance R (e.g., for a set of N power pillars, the resistance of the first power pillar ($R_1$) is the same as the resistance of each other power pillar ($R_2 \ldots R_N$) in the set of N power pillars (or, more simply: $R_1=R_2=\ldots R_N$)). Each power pillar of the second set of power pillars 104 (e.g., in power cell 104A) has a resistance R' (e.g., for a set of M power pillars, the resistance of the first power pillar ($R'_1$) is the same as the resistance of each other power pillar ($R'_2 \ldots R'_N$) in the set of M power pillars (or, more simply: $R'_1=R'_2=\ldots R'_N$)). In some embodiments, the resistance of power pillars in different sets of power pillars is the same (e.g., R=R'). In some embodiments, the resistance of power pillars in different sets of power pillars is different (R≠R'). In some embodiments, the resistance of the P-type transistors and the N-type transistors are different.

Circuit matching is a process performed by selecting the number of power pillars in a power cell to match the electrical performance of different sets of transistors so that the sets of transistors have matching parameters (e.g., switching time, and so forth). Circuit matching is a process performed at a design phase of making a semiconductor device. In some embodiments, circuit matching is performed iteratively, where measured performance data of a semiconductor device is used to modify a previous selection for the number of power pillars in a power cell. In some embodiments, the number N of power pillars in a first set of power pillars is selected (or, adjusted) to alter the performance of the circuit elements (transistors, or some other circuit element) to which the first set of power pillars are electrically connected. Similarly, the number M of power pillars in a second set of power pillars is selected (or, adjusted) to alter the performance of the circuit elements (transistors, or some other circuit element) to which the second set of power pillars are electrically connected. In some embodiments, the number N and the number M are adjusted independently.

Thus, in some embodiments, N=M. In some embodiments, N≠M. In some embodiments, N=1. In some embodiments, N≥1000. In some embodiments, M=1. In some embodiments, M≥1000. A number of power pillars in the first set of power pillars 102 (e.g., power cell 102A) is determined by the resistance target for circuit matching with transistors of the semiconductor device (e.g., inverter chain 110). A number of power pillars in a power cell is increased to decrease the resistance between the voltage source (e.g., a supply voltage (Vdd) or ground (Vss)) and the circuit elements. By increasing the number of power pillars, the overall resistance between the voltage source and the circuit elements decreases. In some embodiments of low power circuit applications, for power cells with more than 1000 power pillars electrically connected in parallel, the rate of change of the resistance decrease tends to flatten with increasing numbers of power pillars, consuming additional space for smaller decreases in the overall resistance. In some embodiments, a single power pillar is electrically connected to multiple transistors, such as for semiconductor devices in which resistance is not a significant impact on circuit matching, and for which area constraints are significant factors. In some embodiments of high power and high current circuit applications, more than 1000 power pillars are electrically connected to circuit elements before IR drop occurs. IR drop is a voltage drop in conductive lines or wires as current flows through a resistive element of the circuit.

In some embodiments, a fuse is manufactured in electrical connection to a power pillar in a power cell (e.g., one fuse per power pillar, or one fuse per set of power pillars). According to some embodiments, a fuse manufactured in electrical connection to a power pillar (or a set of power pillars) is left intact to allow current to flow between a voltage source and the circuit elements to which the power pillars connect by a conductive rail. In some embodiments, one or more fuses are blown in order to reduce the number of power pillars electrically connected to the conductive rail. Thus, in some embodiments of a semiconductor device, a single pattern of power pillars arranged in proximity to circuit area is used to manufacture the semiconductor device, and a post-manufacturing step of testing an electrical circuit therein and blowing fuses to power pillars is used to perform a post-manufacturing adjustment of resistance between a voltage source and the circuit elements to match the circuit elements in the semiconductor device. In a non-limiting example, see semiconductor device layout 1400, see FIG. 14, below, wherein dummy regions 1415A-1415D at corners of the adjoining circuit areas 1402A-1402D have power pillars which do not provide an electrical connection between the circuit elements (not shown) and the voltage source to which power pillars are configured to connect. In some embodiments, the single pattern of power pillars in semiconductor device layout 1400 is around circuit areas 1402A-1402D, and the power cells at the corner are converted into dummy regions by blowing fuses to regulate which power cells electrically connect circuit elements in the circuit areas 1402A-1402D, to voltage sources (Vdd or Vss).

Figure 2A:
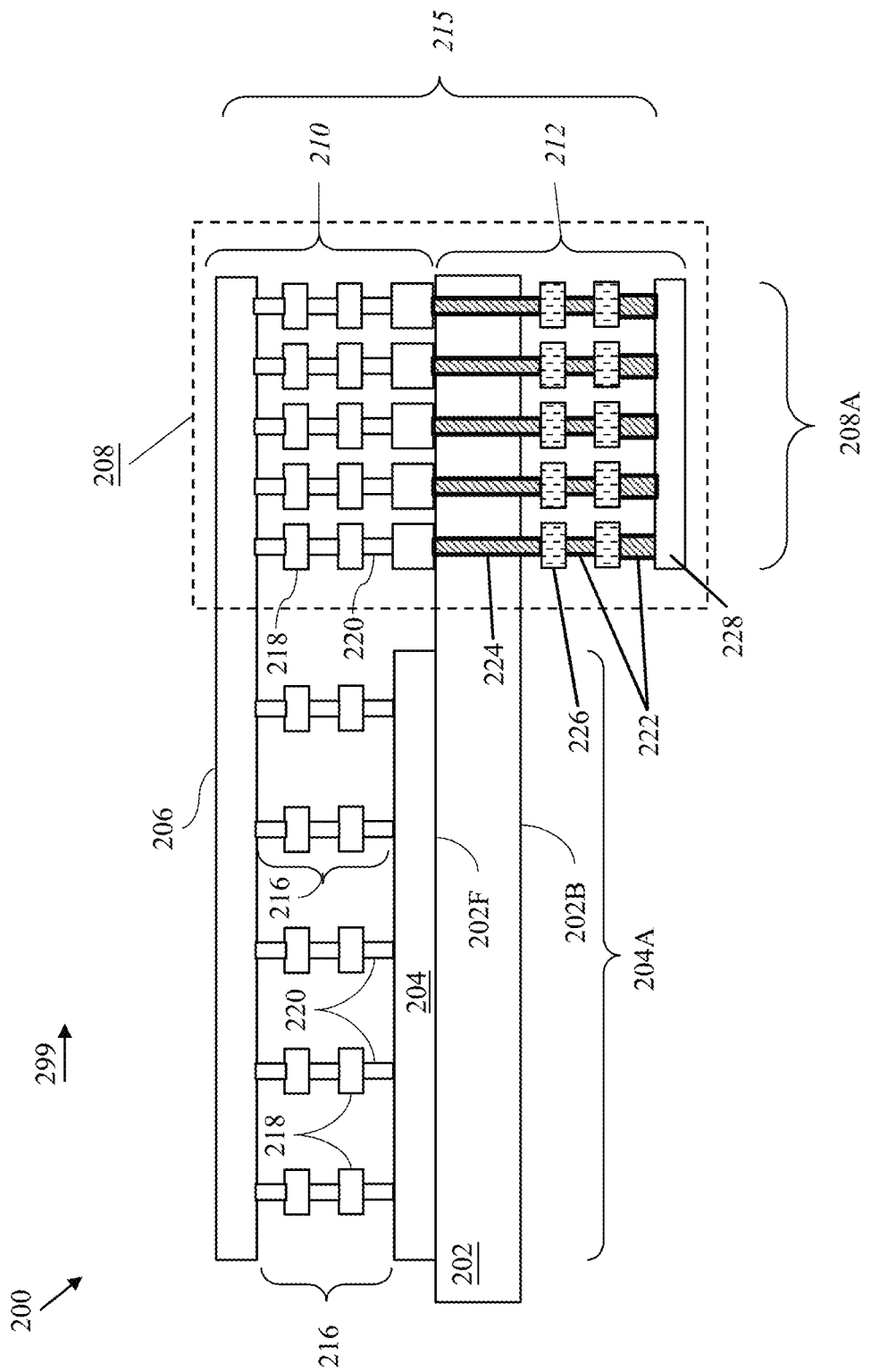
FIG. 2A is a cross-sectional view of a semiconductor device, in accordance with some embodiments.

FIG. 2A is a cross-sectional view of a semiconductor device 200, in accordance with some embodiments. In FIG. 2A, semiconductor device 200 includes a substrate 202 with a device 204 containing circuit elements (e.g., inverter chain 110 of FIG. 1, above) on a top surface 202F of the substrate 202. Device 204 is in a circuit area 204A of the substrate 202. A back surface 202B is the side of the substrate 202 which has no device thereon. Topside power pillars 216 extend above the top surface 202F of substrate 202 to conductive rail 206 (a topside conductive rail). Conductive pillars 216 electrically connect circuit elements (not shown) of the device 204 to conductive rail 206. Conductive pillars include conductive line segments 218 and conductive vias 220 which form an electrical path between the conductive rail 206 and the circuit elements of device 204. Conductive line segments and conductive vias are manufactured at a same time as conductive vias and conductive lines in an interconnect structure between circuit elements of the semiconductor device.

A power cell 208 is located in a power cell region 208A of the substrate 202. Power cell 208 includes power pillars 215 which extend through the substrate 202 and electrically connect to the conductive rail 206 and the conductive rail 228. Power pillars have topside pillar segments 210 and bottom-side pillar segments 212.

Topside pillar segments 210 extend from the top surface 202F of substrate 202 up to conductive rail 206. Topside pillar segments 210 include a plurality of conductive line segments 218 and a plurality of conductive vias 220 which correspond to conductive line segments 218 and conductive vias 220 of conductive pillars 216 in semiconductor device 200.

Bottom-side pillar segments extend from the top surface 202F of substrate 202, through the substrate 202, and down to conductive rail 228. Bottom-side pillar segments 212 include a plurality of power pillar line segments 226 and a plurality of power pillar vias 222 which electrically connect to conductive rail 228. Each bottom-side power pillar 212 includes a through substrate via (TSV) 224 which electrically connects to a topside pillar segment 210.

A conductive rail 228 at a bottom-side of a semiconductor device power cell is connected to a supply voltage (Vdd) or to ground (Vss) according to the type of circuit elements to which conductive rail on the topside of the substrate is electrically connected. In a non-limiting example, referring to the diagram of semiconductor device 100, P-type transistors 112P, 114P, 116P, and 118P electrically connect to the supply voltage (Vdd) through first set of power pillars 102, and N-type transistors 112N, 114N, 116N, and 118N electrically connect to ground (Vss). In some embodiments, a semiconductor device connects to multiple power cells, the power cells being connected to different voltage sources (e.g., supply voltage Vdd, or different supply voltages Vdd1 and Vdd2, or ground Vss).

In some embodiments, the conductive vias 220 of conductive pillars 216 are made of copper, cobalt, nickel, tantalum, titanium, tungsten, or alloys thereof, or other metals suitable for electrical interconnections for a semiconductor device. In some embodiments, the conductive line segments 218 of conductive pillars 216 are made of copper, cobalt, nickel, tantalum, titanium, tungsten, or alloys thereof, or other metals suitable for electrical interconnections for a semiconductor device. Steps for making conductive line segments 218 and conductive vias 220 are presented below in the discussion of method 300 operation 304. Steps for making power pillar line segments 226 and power pillar vias 222 are presented below in the discussion of method 300 operation 308.

Figure 2B:
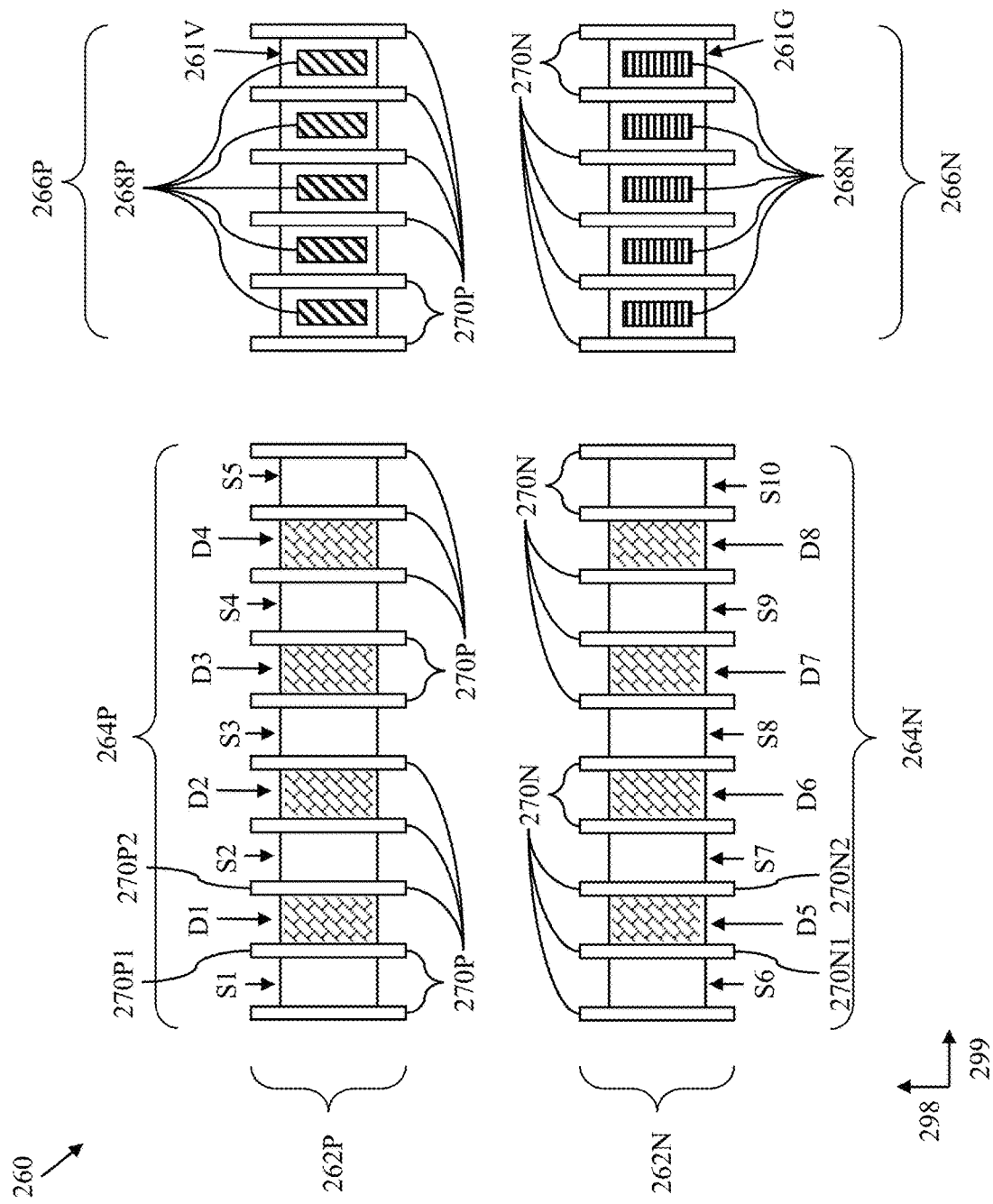
FIG. 2B is a top view of a semiconductor device, in accordance with some embodiments.

FIG. 2B is a top view of a semiconductor device 260, in accordance with some embodiments. Semiconductor device 260 includes a first set of P-doped metal on silicon transistors (e.g., PMOS transistors) 264P. First set of PMOS transistors 264P includes a PMOS active area 262P, a plurality of source regions S1, S2, S3, S4, and S5, a plurality of drain regions D1, D2, D3, and D4, and a plurality of conductive lines 270P. A major axis of PMOS active area 262P extends along a direction 299. Conductive lines 270P extend along a direction 298. Direction 298 is perpendicular to direction 299. Conductive lines 270P between an adjacent source region and drain region serve as gate electrodes for transistors of the first set of PMOS transistors 264P (see, e.g., gate electrode 270P1 between S1 and D1, and gate electrode 270P2 between D1 and S2, where drain D1 is shared between the transistors).

Power cell 266P includes power pillars 268P and conductive lines 270P in a power cell region 261V. Power pillars 268P electrically connect in parallel to a power delivery rail (not shown) which extends over power cell region 261V and over PMOS active area 262P. Power pillars 268P electrically connect to a supply voltage (Vdd) of the semiconductor device 260.

In some embodiments, PMOS active area 262P includes a semiconductor material substrate in which source and drain regions have been formed by adding dopants to define a channel between the source and drain regions. In some embodiments, the semiconductor material includes silicon, silicon germanium, gallium arsenide, or other semiconductor materials suitable for transistors or other circuit elements of a semiconductor device.

Semiconductor device 260 includes a first set of N-doped metal on silicon transistors (e.g., NMOS transistor) 264N. First set of NMOS transistors 264N includes a NMOS active area 262N, a plurality of source regions S6, S7, S8, S9, and S10, a plurality of drain regions D5, D6, D7, and D8, and a plurality of conductive lines 270N. A major axis of NMOS active area 262N extends along a direction 299. Conductive lines 270N extend along a direction 298. Conductive lines 270N between adjacent source and drain regions are gate electrodes for transistors of the first set of NMOS transistors 264N (see gate electrode 270N1 between S6 and D5, and gate electrode 270N2 between D5 and S7, where drain D5 is shared between the transistors).

Power cell 266N includes power pillars 268N and conductive lines 270N in a power cell region 261G. Power pillars 268N electrically connect in parallel to a power delivery rail (not shown) which extends over power cell region 261G and over NMOS active area 262N. Power pillars 268N electrically connect to a ground of the semiconductor device 260.

In some embodiments, the substrate includes a transistor region (or a circuit area) which includes a plurality of circuit elements such as NMOS active area 262N or PMOS active area 262P. In some embodiments, a substrate includes one or more power cell regions such as power cell region 261V and power cell region 261G. In some embodiments, power cell regions adjoin circuit areas or transistor regions. In some embodiments, power cell regions are separated from circuit areas or transistor regions.

Figure 3:
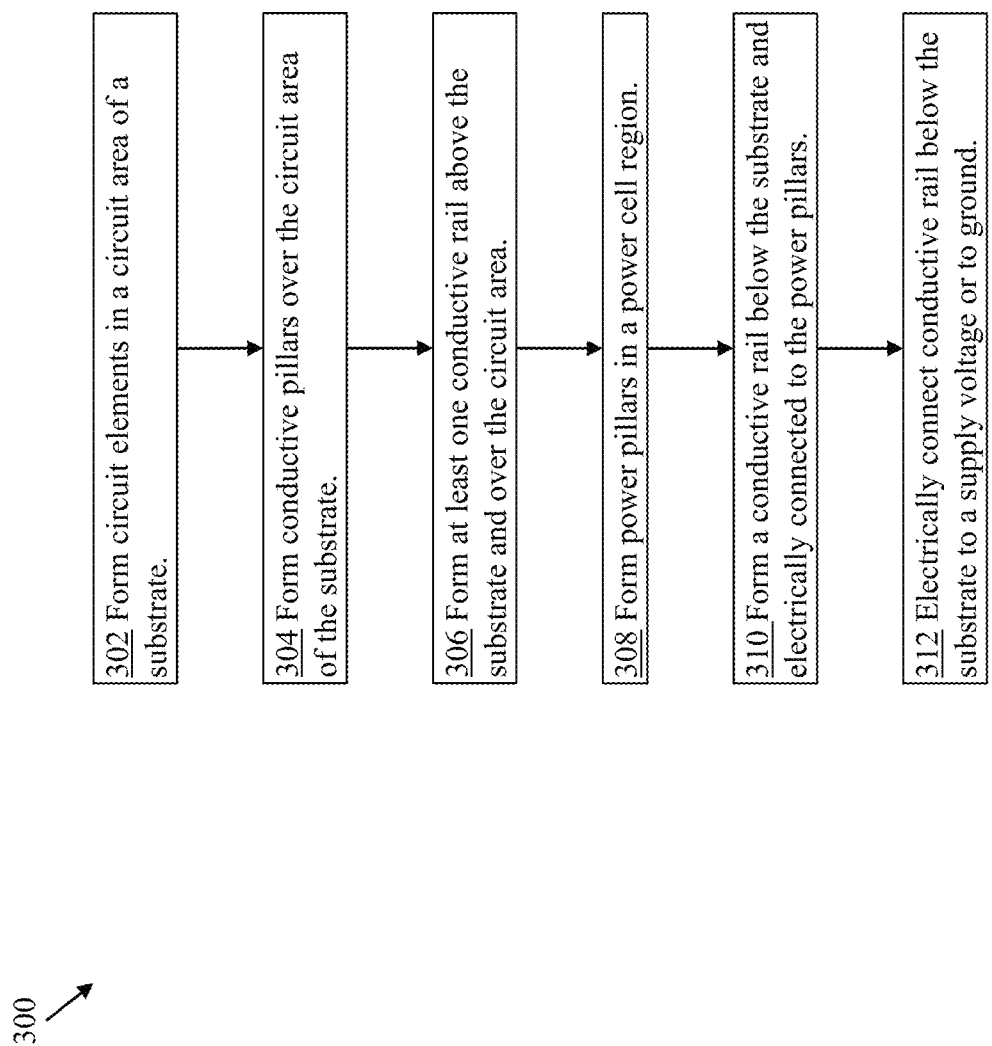
FIG. 3 is a flow diagram of a method of making a semiconductor device, in accordance with some embodiments.

FIG. 3 is a flow diagram of a method 300 of making a semiconductor device, in accordance with some embodiments. Method 300 includes an operation 302 in which circuit elements are formed in a circuit area of a substrate (for example, see FIG. 2 circuit area 204A). In some embodiments, the substrate is semiconductor material substrate in which source and drain regions have been formed by adding dopants using, e.g., an implant process. In some embodiments, the semiconductor material includes silicon, silicon germanium, gallium arsenide, or other semiconductor materials suitable for transistors or other circuit elements of a semiconductor device.

In some embodiments, forming transistors includes operations of adding dopants to the semiconductor material in the active areas by, e.g., implanting dopants into the semiconductor material through openings in a layer of mask material or patterning material. In some embodiments, forming transistors includes operations of depositing a layer of mask material over the top surface of the substrate, forming a pattern in the layer of mask material, forming openings in the layer of mask material according to the pattern, and adding dopant atoms into the substrate to form source and drain regions for the semiconductor device.

Method 300 includes an operation 304, wherein conductive pillars are formed over a circuit area of the substrate. A conductive pillar is a set of electrically connected conductive vias and/or conductive line segments which electrically connect to circuit elements in an active area of the substrate, and to a conductive rail over the active area. In some embodiments, conductive pillars are formed by depositing an inter layer dielectric (ILD) material over the semiconductor material substrate using, e.g., a chemical vapor deposition process. In some embodiments, the ILD material is deposited by a spin-on deposition followed by a heat treatment to remove solvent from the spun-on material, leaving behind voids in a low-dielectric constant material (e.g., with a dielectric constant less than the dielectric constant of silicon dioxide). According to some embodiments, the ILD material is silicon dioxide or a low-k dielectric material (with a dielectric constant smaller than the dielectric constant of silicon dioxide).

In some embodiments, a layer of patterning material is deposited over the ILD material, and a pattern transferred thereto. In some embodiments, the layer of patterning material is a photoresist material. In some embodiments, the layer of patterning material is compatible with ultraviolet lithography methods. Patterning material compatible with photolithography or ultraviolet lithography is deposited by a spin-on deposition process and baking to drive off solvent in the spun-on material. In some embodiments, the layer of patterning material is a hardmask (e.g., a layer of silicon nitride, silicon carbide, or some other etch-resistant inorganic layer) and a pattern is transferred to the hardmask by an etch process through openings in a layer of photolithography material deposited over the hardmask material.

In some embodiments, an etch process is performed through openings in the layer of patterning material to form corresponding openings in the ILD material, wherein the layer of material below the ILD material is exposed through the openings. In some embodiments, after forming openings in the ILD material, the openings are filled with a conductive material to carry electrical current. In some embodiments, conductive pillars are formed by repeating, one or more times, the steps described above until the conductive pillar has grown to include several conductive material segments (e.g., conductive vias or conductive line segments) vertically arranged above and electrically connected to the active areas of the semiconductor device.

In some embodiments, conductive pillars electrically connect to source or drain regions of transistors. In some embodiments, the conductive pillars electrically connect to analog circuit elements. In some embodiments, the conductive pillars electrically connect to decoupling capacitors such as MIM (metal insulator metal), MOM (metal oxide metal), varactors, and MOSCAP, or memory structures of the semiconductor device.

Method 300 includes an operation 306, wherein a conductive rail is formed over a circuit area. In some embodiments, a conductive rail is manufactured by depositing an ILD material, depositing a layer of patterning material over the ILD material, transferring a pattern to the ILD material, and etching through the ILD material through to expose the materials below the ILD material. In some embodiments, the conductive rail is formed by depositing a conductive material (e.g., copper, aluminum, alloys of copper and aluminum, or other metals compatible with forming conductive lines in an interconnect structure of a semiconductor device). In some embodiments, the conductive material is deposited by sputtering. In some embodiments, the conductive material is deposited by electroplating. In some embodiments, the excess conductive material deposited against the surface of the ILD material is removed by a chemical mechanical polishing (CMP) process to expose the surface of the ILD material, while a portion of the conductive material is left behind in the opening formed in the ILD material.

Method 300 includes an operation 308 wherein power pillars are formed in a power cell region of the substrate. Topside power pillars (see, e.g., topside pillar segments 210 in FIG. 2A) extend up from a top surface of the substrate, where the device is located, up to the conductive rail which electrically connects the power pillars to the conductive pillars. Bottom-side power pillars (see, e.g., bottom-side pillar segments 212 in FIG. 2A) extend through the substrate and below the bottom surface of the substrate toward a conductive rail (see, e.g., conductive rail 228 in FIG. 2A) which connects to a supply voltage or to ground. Portions of topside power pillars are manufactured at a same time as the portions of conductive pillars which extend from the conductive rail to the circuit elements in the circuit area. Portions of the bottom-side power pillars are manufactured in a manner consistent with the manufacture of topside power pillars, after a semiconductor device over the topside is completed, or partially completed, and the substrate is flipped over to undergo the steps of forming, e.g., a topside interconnect structure, or formation of a conductive pillar, on the bottom of the substrate.

Method 300 includes an operation 310 wherein a conductive rail is formed below the substrate, and electrically connected to the power pillars. A conductive rail below the substrate is formed in a manner substantially similar to the formation of a conductive rail over the circuit area (see operation 306, above): depositing an ILD material, depositing a layer of patterning material over the ILD material, transferring a pattern to the ILD material, and etching openings in the ILD material to expose the materials below the ILD material. In some embodiments, the conductive rail is formed by depositing a conductive material (e.g., copper, aluminum, alloys of copper and aluminum, or other metals compatible with forming conductive lines in an interconnect structure of a semiconductor device). In some embodiments, the conductive material is deposited by sputtering. In some embodiments, the conductive material is deposited by electroplating. In some embodiments, the excess conductive material deposited against the surface of the ILD material is removed by a chemical mechanical polishing (CMP) process to expose the surface of the ILD material, while a portion of the conductive material is left behind in the opening formed in the ILD material.

In some embodiments, conductive rails on the top side of a substrate and on the back side of the substrate have a same dimension and composition. In some embodiments, the conductive rails on the top side and back side of the substrate have different dimensions, based on the current load to be carried by the conductive rails during operation of the semiconductor device.

Method 300 includes an operation 312 wherein a conductive rail below the substrate is electrically connected to a supply voltage or to ground. A conductive rail is electrically connected to a supply voltage, or to ground, through an interconnect structure manufactured against the bottom surface of the substrate (or, against the layer of the semiconductor device having the bottom-side conductive rail therein). Steps associated with connecting a conductive rail to a supply voltage or to ground are similar to steps associated with forming a bottom-side power pillar described above in operation 308.

Figure 4:
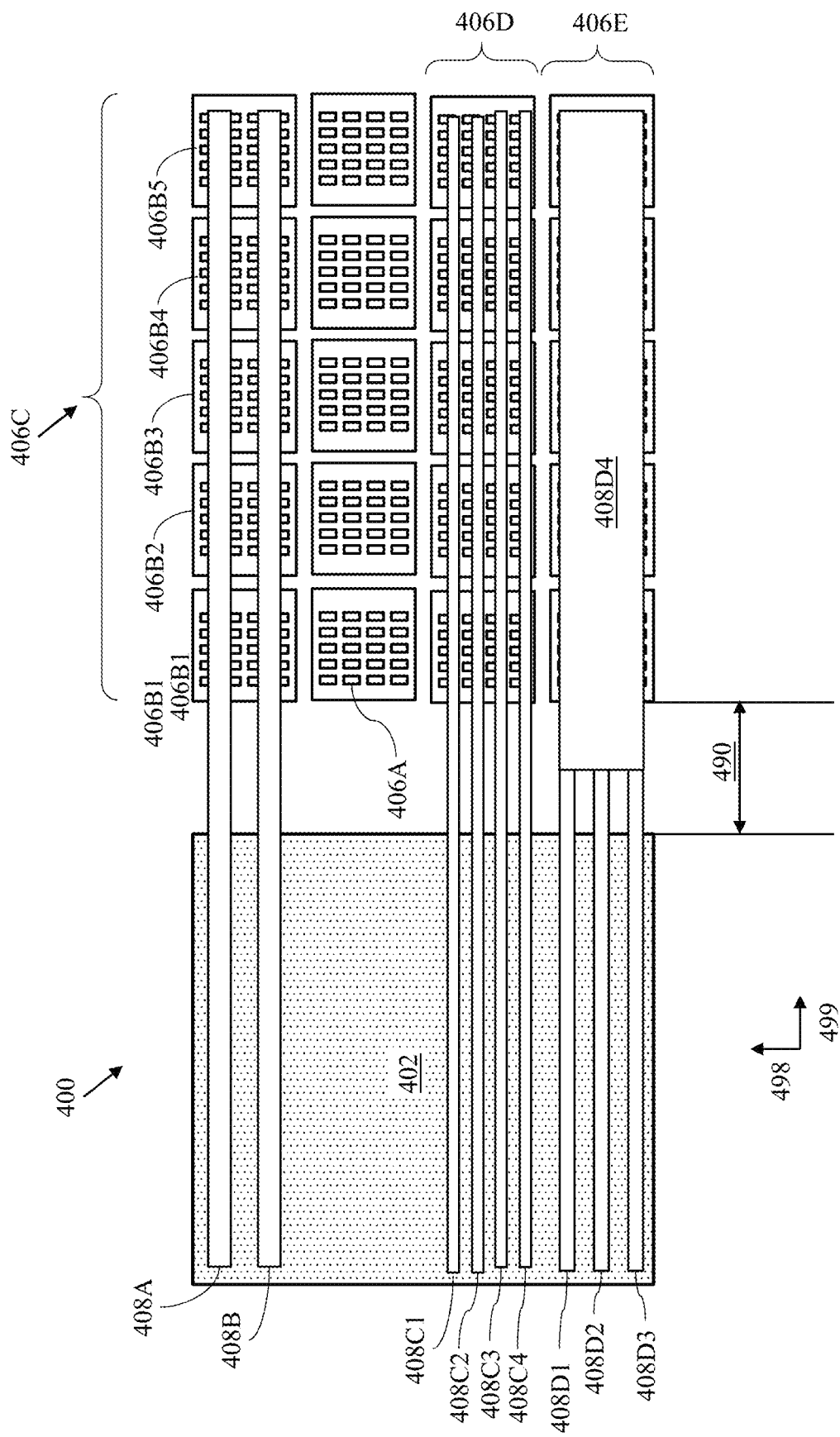
FIG. 4 is a top view of a semiconductor device layouts, in accordance with some embodiments.

FIG. 4 is a top view of a semiconductor device layout 400, in accordance with some embodiments. In FIG. 4, the circuit area 402 includes a set of transistors or other circuit elements which are on a substrate (not shown, but see substrate 202 in FIG. 2A). Circuit area 402 is separated from a power cell array 406C by a separation distance 490. In some embodiments, the circuit area is adjacent to the power cell regions (e.g., the circuit area and the power cell array are contiguous). Separation distance 490 is measured along the direction 499. Direction 498 is along an edge of the circuit area 402 and perpendicular to direction 499. Power cell array 406C includes a plurality of power cell regions 406B, with each region having multiple power pillars 406A. In some embodiments, separation distance 490 ranges from about 0.001 μm to about 200 μm. In some embodiments, power cell array 406C is adjacent to the circuit area 402. A separation distance is determined according to the availability of space in an integrated circuit layout. In some embodiments, separation distances of greater than 200 μm are associated with signal transmission lag due to the distance between the power cell array and the circuit elements in circuit area, negating the lowered resistance of the power cell supplying an electrical connection to the circuit element.

Conductive rail 408A and conductive rail 408B are arranged over power cells 406B1, 406B2, 406B3, 406B4, and 406B5 in power cell array 406C. In some embodiments, the conductive rails 408A and 408B are connected to different circuit elements. In some embodiments, conductive rails 408A and 408B are connected to different sets or types of circuit elements, with a common type of electrical connection (e.g., supply voltage Vdd or ground Vss). Conductive rails 408A and 408B are connected to two rows of power pillars in each of power cells 406B1, 406B2, 406B3, 406B4, and 406B5 in power cell array 406C.

Conductive rails 408C1, 408C2, 408C3, and 408C4 are electrically connected to a single row of power pillars in power cells in power cell row 406D. Conductive rails 408D1, 408D2, and 408D3 are electrically connected to a power pad 408D4, where power pad 408D4 electrically connects to each of the power pillars in power cell row 406E, and the three conductive pillars electrically connect to circuit elements in circuit area 402. Conductive rails in semiconductor device layout 400 extend along a direction 499. A number of conductive rails, and the number of power pillars to which a conductive rail connects, is a function of the resistance reduction used in a semiconductor circuit layout to perform circuit matching as described above. In some embodiments, conductive rails such as conductive rail 408C1 are used for semiconductor devices to reduce loading effects in manufacturing the semiconductor device (e.g., to reduce loading when manufacturing the conductive rails). In some embodiments, a power pad such as power pad 408D4 is used when loading effects in the power cell region are not significant, and a large number of power pillars are to be connected to the circuit area, but loading effects over the circuit area are more significant.

Figure 5:
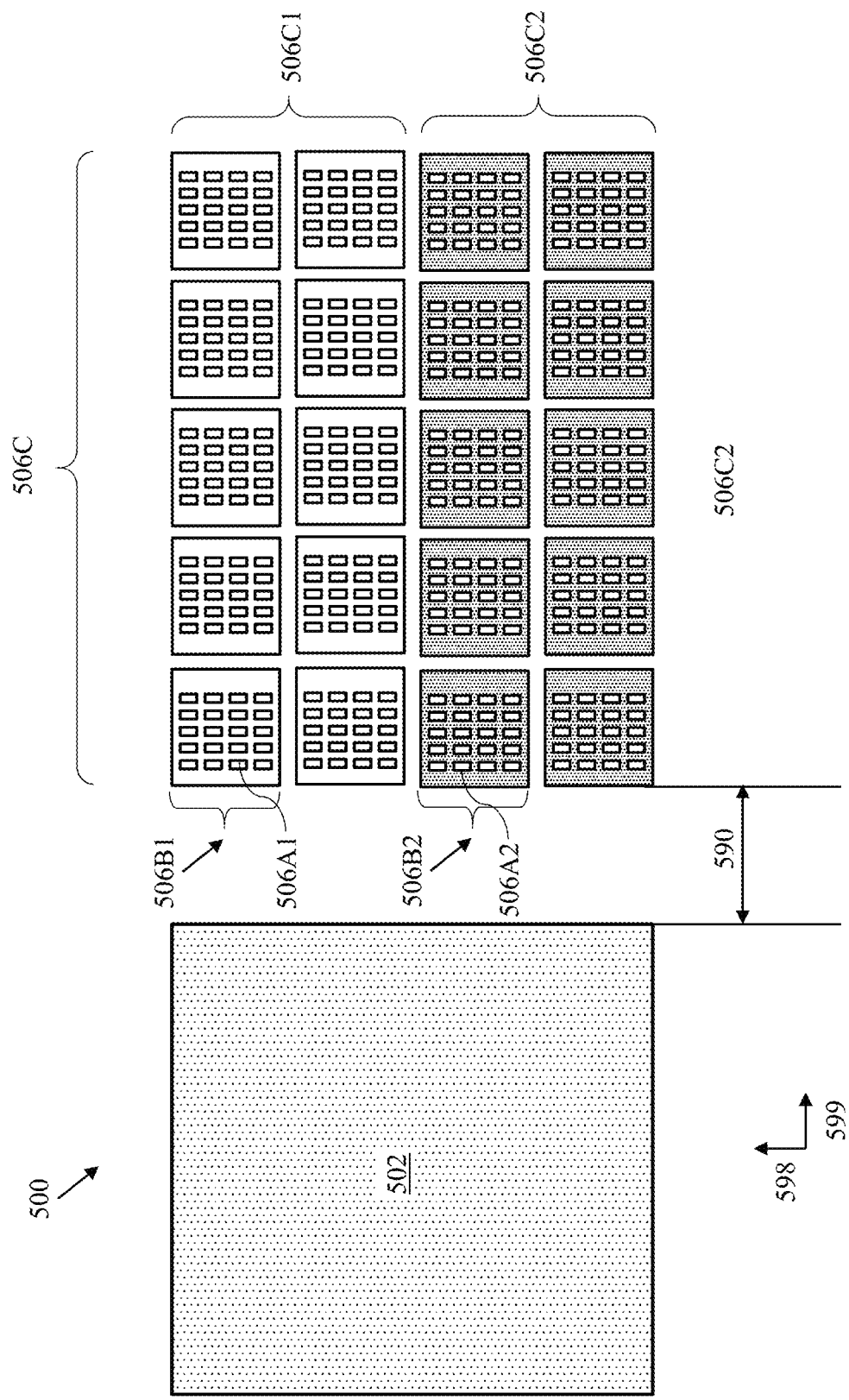
FIG. 5 is a top view of a semiconductor device layouts, in accordance with some embodiments.

FIG. 5 is a top view of a semiconductor device layout 500, in accordance with some embodiments. In semiconductor device layout 500, elements of the layout which have a same function and structure as the semiconductor layout in semiconductor device layout 400 have a same identifying numeral, incremented by 100. Circuit area 502 is separated from power array 506 by a separation distance 590. Separation distance 590 ranges from about 0.001 μm to about 200 μm. Separation distances greater than about 200 μm induce signal transmission lag which counters the speed improvements associated with reduced resistance of the electrical connection to a circuit element, slowing a semiconductor device down.

Power array 506C is divided into a first power array region 506C1 and a second power array region 506C2. First power array region 506C1 is electrically connected to a supply voltage Vdd. Second power array region 506C2 is electrically connected to ground (Vss). First power array region 506C1 includes a first power cell 506B1 and a first power pillar 506A1. Second power array region 506C2 has a power cell 506B2 with a second power pillar 506A2. First power pillar 506A1 is electrically connected to the supply voltage Vdd. Second power pillar 506A2 is electrically connected to ground (Vss). The power array 506 is electrically connected to circuit area 502 by conductive rails (not shown) which are similar to embodiments of conductive rails described in semiconductor device layout 400, above. Separation distance 590 is measured along direction 599, while the first power array region 506C1 and the second power array region 506C2 are separated along the direction 598.

Figure 6:
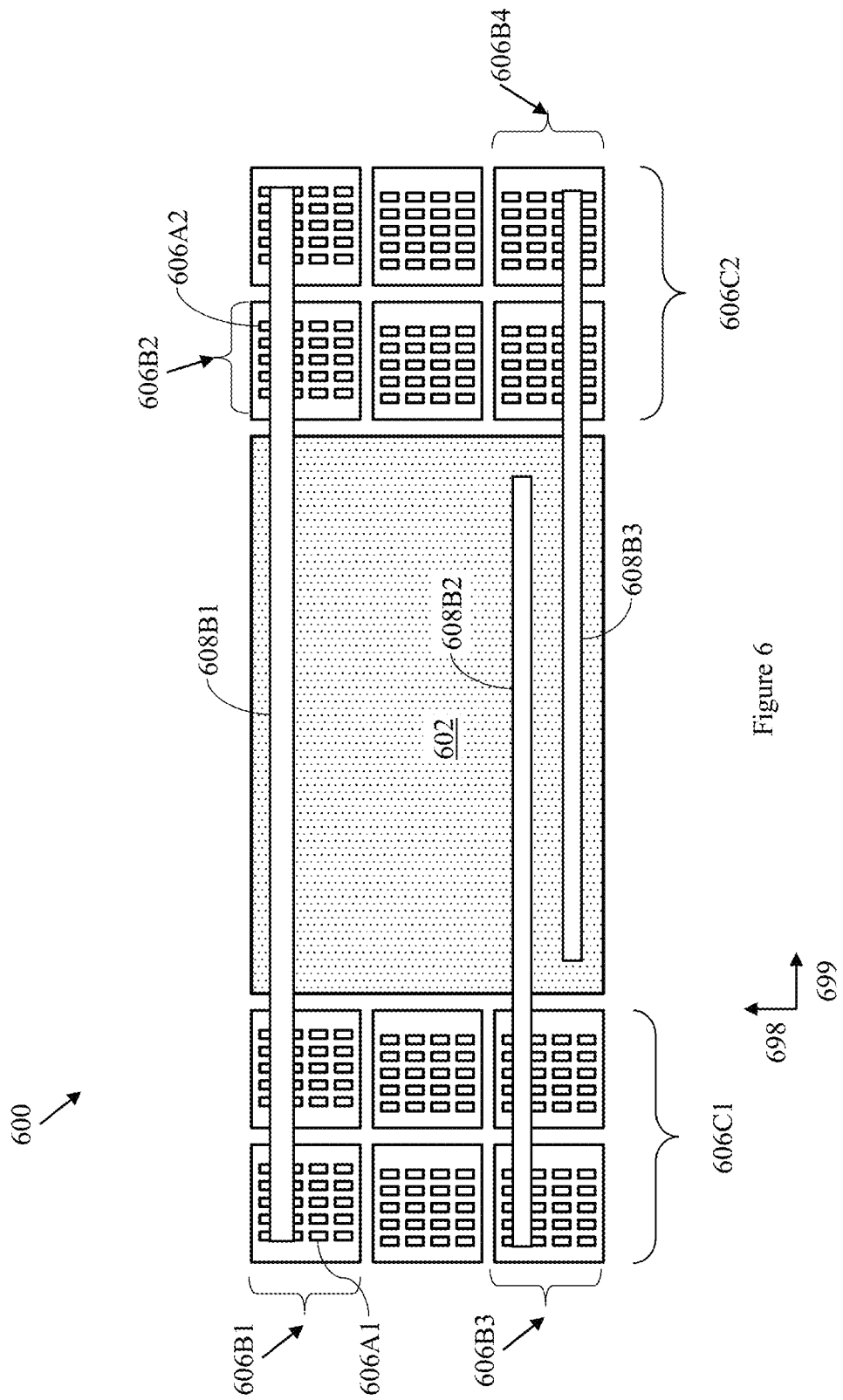
FIG. 6 is a top view of a semiconductor device layouts, in accordance with some embodiments.

FIG. 6 is a top view of a semiconductor device layout 600, in accordance with some embodiments. Semiconductor device layout 600 includes a circuit area 602. Circuit area 602 is adjoined at opposite sides along the direction 699 by a power row 606C1 and a power row 606C2. Power cells in semiconductor device layout 600 are adjacent to each other, or contiguous, in a power cell region. Power row 606C1 includes a power cell 606B1 with a first power pillar 606A1. Power row 606C2 includes a power cell 606B2 with a second power pillar 606A2. Power row 606C1 and power row 606C2 electrically connect to a supply voltage Vdd. Power cells 606B1 and 606B2 are electrically connected by conductive rail 608B1 which electrically connects to power pillars in power cell 606B1 and power cell 606B2 and extends over circuit area 602 along the direction 699. Conductive rail 608B2 electrically connects to power row 606B3 and extends across power cells 606B2, and part way across circuit area 602. Conductive rail 608B3 electrically connects to power row 606C2 and extends across power cells 606B4 and partway across circuit area 602 from an opposite direction than conductive rail 608B2.

Figure 7:
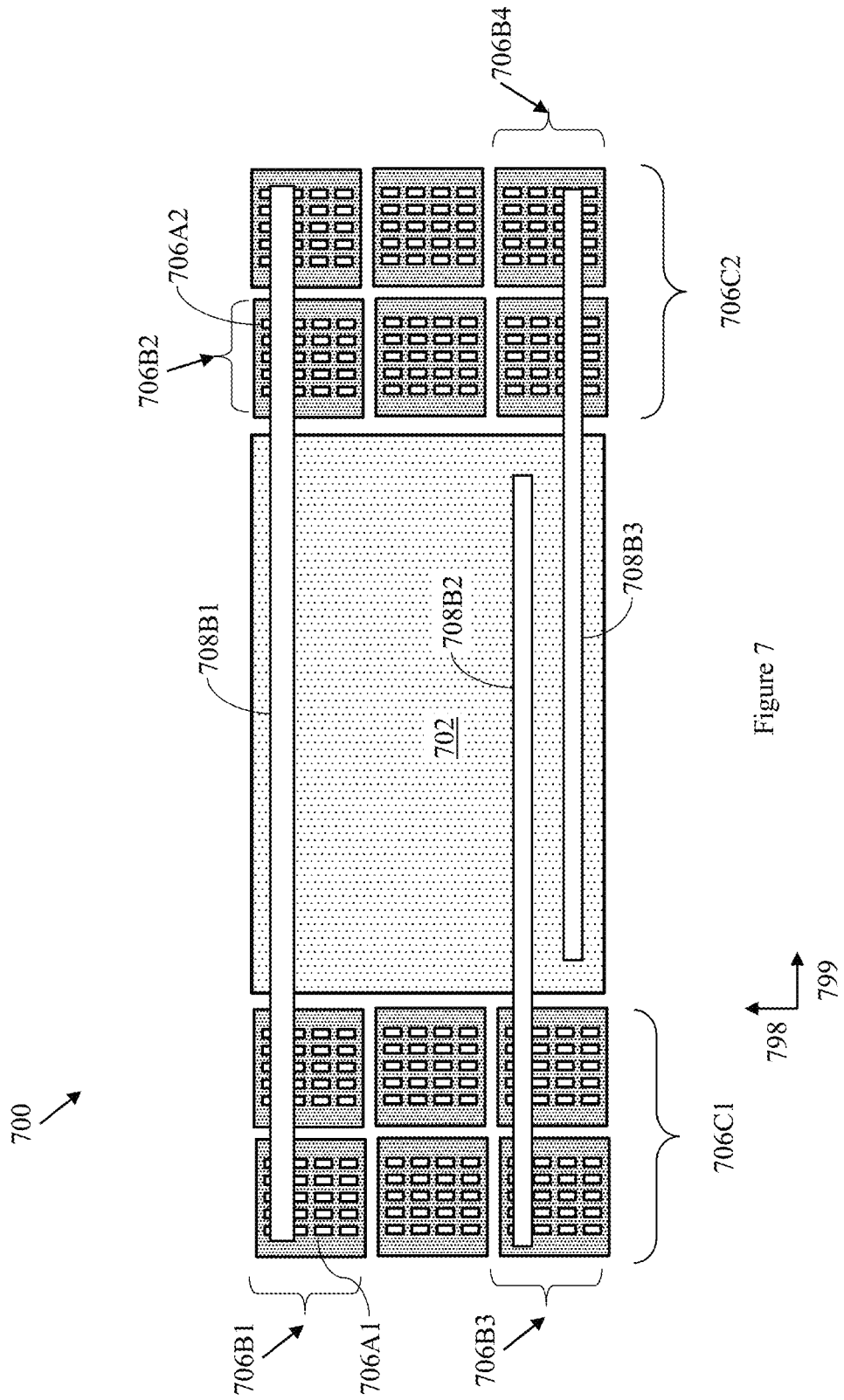
FIG. 7 is a top view of a semiconductor device layouts, in accordance with some embodiments.

FIG. 7 is a top view of a semiconductor device layout 700, in accordance with some embodiments. Semiconductor device layout 700 includes a circuit area 702. Circuit area 702 is adjoined at opposite sides along the direction 799 by a power row 706C1 and a power row 706C2. Power row 706C1 includes a power cell 706B1 with a power pillar 706A1. Power row 706C2 includes a power cell 706B2 with a second power pillar 706A2. Power row 706C1 and power row 706C2 electrically connect to ground (Vss). Power cells 706B1 and 706B2 are electrically connected by conductive rail 708B1 which electrically connects to power pillars in power cell 706B1 and power cell 706B2, and which extends over circuit area 702 along the direction 799. Conductive rail 708B2 electrically connects to power row 706C1 in power cells 706B3 and part way across circuit area 702. Conductive rail 708B3 electrically connects to power cells 706B4 in power row 706C1 and extends partway across circuit area 702 from an opposite direction than conductive rail 708B2.

Figure 8:
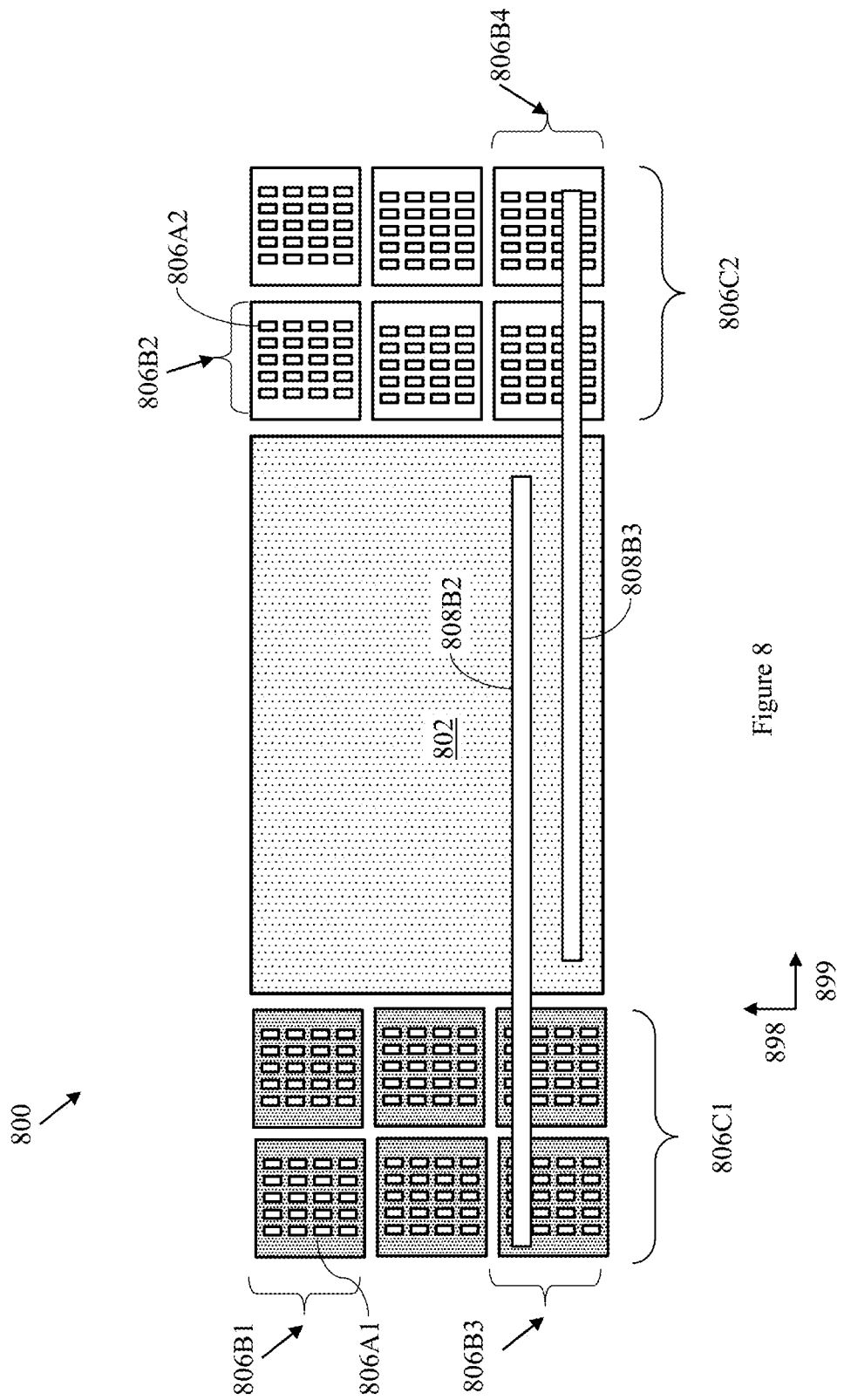
FIG. 8 is a top view of a semiconductor device layouts, in accordance with some embodiments.

FIG. 8 is a top view of a semiconductor device layout 800, in accordance with some embodiments. Semiconductor device layout 800 includes a circuit area 802. Circuit area 802 is adjoined at opposite sides along the direction 899 by a power row 806C1 and a power row 806C2. Power row 806C1 includes a power cell 806B1 with a power pillar 806A1. Power row 806C2 includes a power cell 806B2 with a second power pillar 806A2. Power row 806C1 electrically connects to a supply voltage (Vdd). Power row 806C2 electrically connects to ground (Vss). Because power row 806C1 and power row 806C2 are electrically connected to different voltage sources (e.g., a supply voltage and ground), the first and power rows are not directly electrically connected (see, e.g., conductive rail 708B1 in FIG. 7 for a conductive rail which electrically connects two power rows). In some embodiments, conductive rails electrically connected to different voltage sources, as described above, are electrically connected to the same circuit elements in the circuit area. In some embodiments, conductive rails electrically connected to different voltage sources are electrically connected to different circuit elements in the circuit area. For example, conductive rail 808B2 electrically connects to power cells 86B3 in power row 806C1, and part way across circuit area 802. Conductive rail 808B3 electrically connects to power cells 806B4 in power row 806C2, and extends partway across circuit area 802 along direction 899 (e.g., perpendicular to an edge of the circuit area extending between circuit area 802 and power row 806C2.

Figure 9:
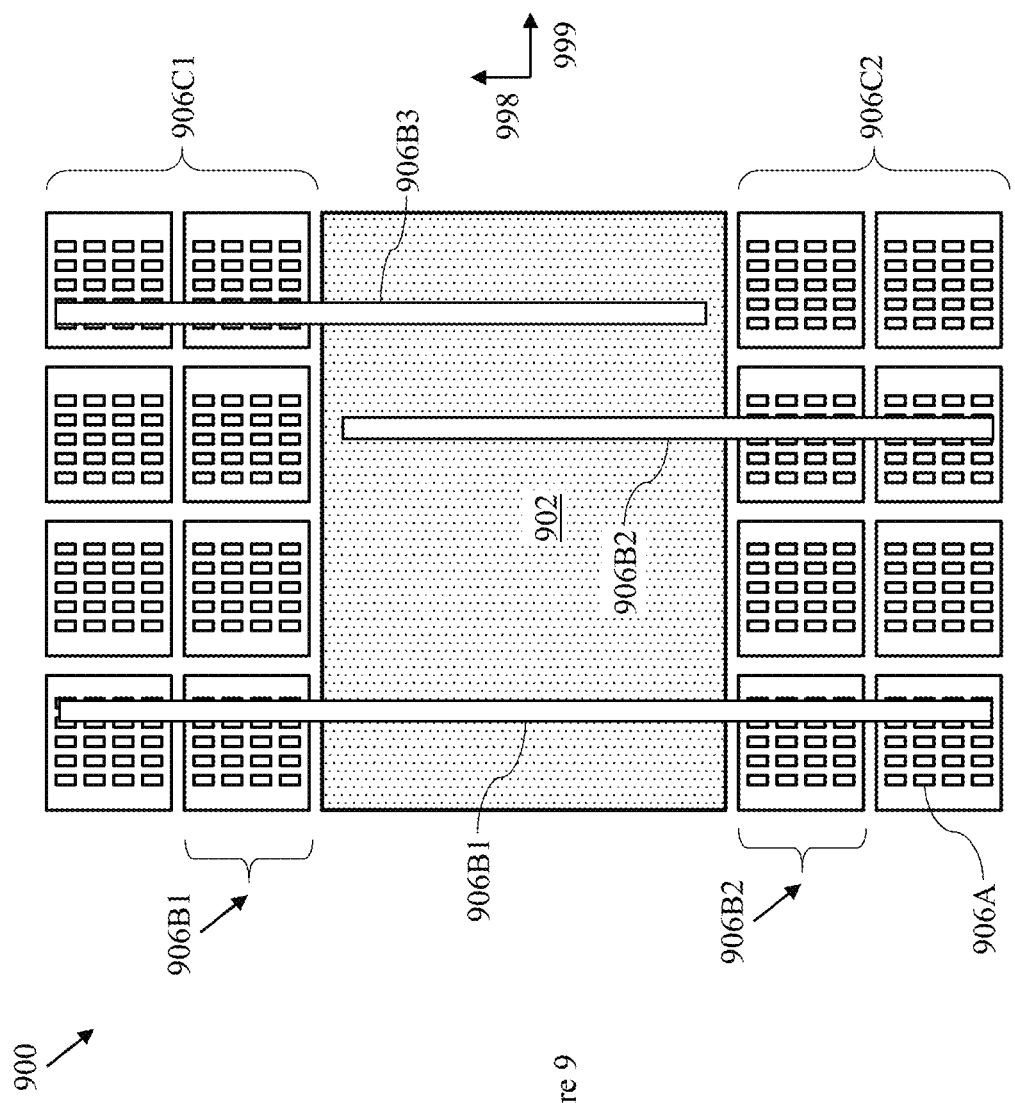
FIG. 9 is a top view of a semiconductor device layouts, in accordance with some embodiments.

FIG. 9 is a top view of a semiconductor device layout 900, in accordance with some embodiments. In semiconductor device layout 900, a circuit area 902 is bounded by power column 906C1 and power column 906C2, at opposite sides of circuit area 902. Conductive rails extend over circuit area 902 and electrically connect the power column 906C1 and the power column 906C2 to circuit elements (not shown) in circuit area 902. Power column 906C1 and power column 906C2 are electrically connected to a same voltage source. In some embodiments, the voltage source is a supply voltage (Vss). In some embodiments, the voltage source is ground (Vss). Conductive rail 906B1 is electrically connected to power pillars in power column 906C1 and power column 906C2, and electrically connects to circuit elements in circuit area 902. Conductive rail 906B2 is electrically connected to power pillars in power column 906C1, extends part way across circuit area 902, and electrically connects to circuit elements in circuit area 902. Conductive rail 906B3 is electrically connected to power pillars in power column 906C2, extends part way across circuit area 902, and electrically connects to circuit elements in circuit area 902. Conductive rails 906B1, 906B2, and 906B3 extend along the direction 298, perpendicular to the direction 299. Direction 298 is a direction perpendicular to a major axis of the active areas of transistors in circuit area 902, and direction 299 is a direction parallel to the major axis of the active areas of transistors in the circuit area 902.

Figure 10:
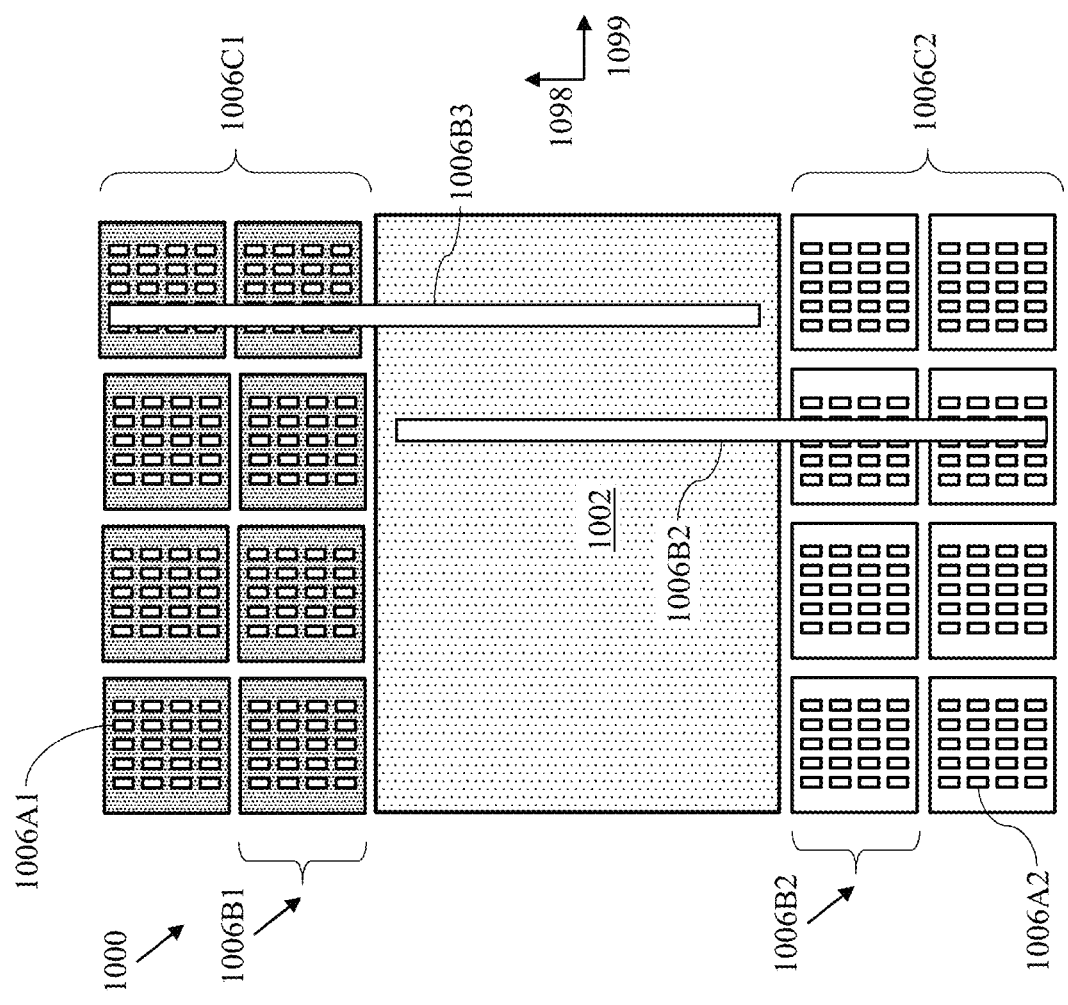
FIG. 10 is a top view of a semiconductor device layouts, in accordance with some embodiments.

FIG. 10 is a top view of a semiconductor device layout 1000, in accordance with some embodiments. Elements of semiconductor device layout 1000 which have a same function or structure as elements have a same identifying numeral as an element of semiconductor device layout 900, incremented by 100. In semiconductor device layout 1000, a circuit area 1002 is bounded by power column 1006C1 and power 1006C2, at opposite sides of circuit area 1002. Conductive rails extend over circuit area 1002 and electrically connect the power column 1006C1 and the power 1006C2 to circuit elements (not shown) in circuit area 1002. Power column 1006C1 and power 10106C2 are electrically connected to different voltage sources. Power column 1006C1 is electrically connected to a supply voltage (Vdd), and power 1006C2 is electrically connected to ground (Vss). Conductive rail 1006B2 is electrically connected to power pillars in power column 1006C1, extends part way across circuit area 1002, and electrically connects to circuit elements in circuit area 1002. Conductive rail 1006B3 is electrically connected to power pillars in power 1006C2, extends part way across circuit area 1002, and electrically connects to circuit elements in circuit area 1002. Conductive rails 1006B1, 1006B2, and 1006B3 extend along the direction 298, perpendicular to the direction 299. Direction 298 is a direction perpendicular to a major axis of the active areas of transistors in circuit area 1002, and direction 299 is a direction parallel to the major axis of the active areas of transistors in the circuit area 1002. Power pillar 1006A1 and power pillar 1006A2 are located in the power cells of semiconductor device layout 1000 and are representative of other conductive power pillars in the device.

Figure 11:
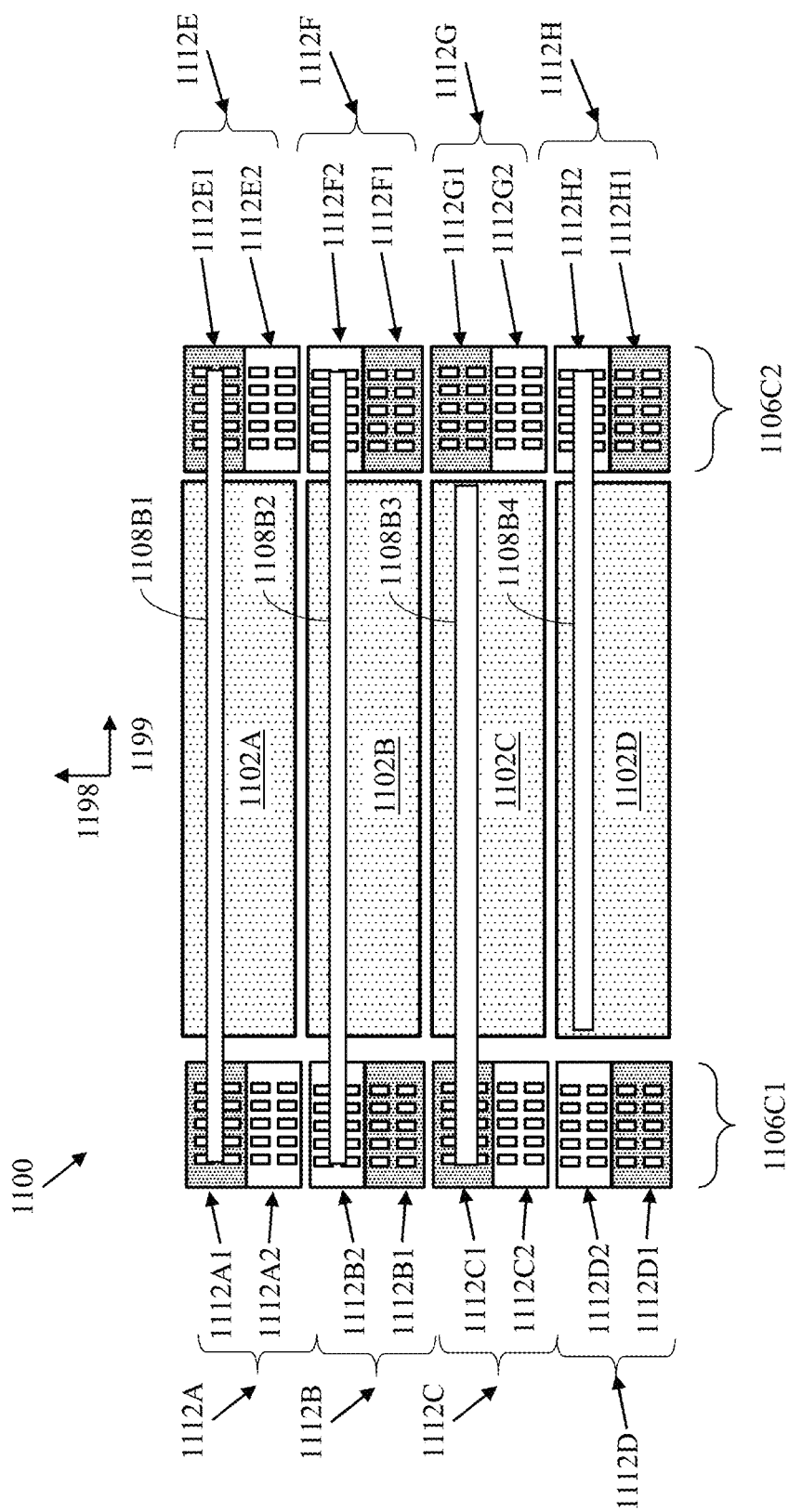
FIG. 11 is a top view of a semiconductor device layouts, in accordance with some embodiments.

FIG. 11 is a top view of a semiconductor device layout 1100, in accordance with some embodiments. Semiconductor device layout 1100 includes four circuit areas 1102A, 1102B, 1102C, and 1102D. Power cells in power rows at opposite sides of circuit areas 1102A, 1102B, 1102C, and 1102D are split (e.g., the power rows are split, or have power subrows) A split power row is a power row where the power pillars in the power cells of the split power row are electrically connected to different supply voltages. A power subrow is a portion of a power row, or power cell in the power row, in which all the power pillars are electrically connected to a same voltage source (a supply voltage (Vdd), or ground (Vss)). In some embodiments, the first voltage source for a split power row is a supply voltage (Vdd) and the second voltage source for a split power row is ground (Vss). In some embodiments, the first voltage source for a split power row is ground (Vss) and the second voltage source for a split power row is a supply voltage (Vdd).

Circuit area 1102A is adjoined, at opposite sides in the direction 1199, by two split power rows: split power row 1112A and split power row 1112E. Split power row 1112A includes a power subrow 1112A1, and a power subrow 1112A2. Power subrow 1112A1 is electrically connected to a first voltage source, and power subrow 1112A2 is electrically connected to a second voltage source. Split power row 1112E includes a power subrow 1112E1 and a power subrow 1112E2. Power subrow 1112E1 is electrically connected to the first voltage source and power subrow 1112F2 is electrically connected to a second voltage source. Power subrow 1112A1 and power subrow 1112E1 are at a same side of circuit area 1102A along the direction 1198. Power subrow 1112A2 and power subrow 1112E2 are at a same side of circuit area 1102A along the direction 1198.

Circuit area 1102B is adjoined, at opposite sides in the direction 1199, by two split power rows: split power row 1112B and split power row 1112F. Split power row 1112B includes a power subrow 1112B1, and a power subrow 1112B2. Power subrow 1112B1 is electrically connected to a first voltage source, and power subrow 1112B2 is electrically connected to a second voltage source. Split power row 1112F includes a power subrow 1112F1 and a power subrow 1112F2. Power subrow 1112F1 is electrically connected to the first voltage source and power subrow 1112F2 is electrically connected to a second voltage source. Power subrow 1112B1 and power subrow 1112F1 are at a same side of circuit area 1102AB along the direction 1198. Power subrow 1112B2 and power subrow 1112F2 are at a same side of circuit area 1102B along the direction 1198.

Circuit area 1102C is adjoined, at opposite sides in the direction 1199, by two split power rows: split power row 1112C and split power row 1112G. Split power row 1112C includes a power subrow 1112C1, and a power subrow 1112C2. Power subrow 1112C1 is electrically connected to a first voltage source, and power subrow 1112C2 is electrically connected to a second voltage source. Split power row 1112G includes a power subrow 1112G1 and a power subrow 1112G2. Power subrow 1112G1 is electrically connected to the first voltage source and power subrow 1112G2 is electrically connected to a second voltage source. Power subrow 1112C1 and power subrow 1112G1 are at a same side of circuit area 1102C along the direction 1198. Power subrow 1112C2 and power subrow 1112G2 are at a same side of circuit area 1102C along the direction 1198.

Circuit area 1102D is adjoined, at opposite sides in the direction 1199, by two split power rows: split power row 1112D and split power row 1112H. Split power row 1112D includes a power subrow 1112D1, and a power subrow 1112D2. Power subrow 1112D1 is electrically connected to a first voltage source, and power subrow 1112D2 is electrically connected to a second voltage source. Split power row 1112H includes a power subrow 1112H1 and a power subrow 1112H2. Power subrow 1112H1 is electrically connected to the first voltage source and power subrow 1112H2 is electrically connected to a second voltage source. Power subrow 1112D1 and power subrow 1112H1 are at a same side of circuit area 1102D along the direction 1198. Power subrow 1112D2 and power subrow 1112H2 are at a same side of circuit area 1102D along the direction 1198.

Conductive rail 1108B1 is electrically connected to power pillars of both power subrow 1112A1 and power subrow 1112E1, and to circuit elements (not shown) in circuit area 1102A. Conductive rail 1108B2 is electrically connected to power pillars of both power subrow 1112B2 and power subrow 1112F2, and to circuit elements (not shown) in circuit area 1102A.

Conductive rail 1108B3 is electrically connected to power pillars of power subrow 1112C1, and to circuit elements (not shown) in circuit area 1102A. Conductive rail 1108B3 is electrically isolated from the power subrow 1112G1. Conductive rail 1108B4 is electrically connected to power pillars in power subrow 1112H2, and to circuit elements (not shown) in circuit area 1102A. Conductive rail 1108B4 is electrically isolated from power pillars of power subrow 1112D2.

Figure 12:
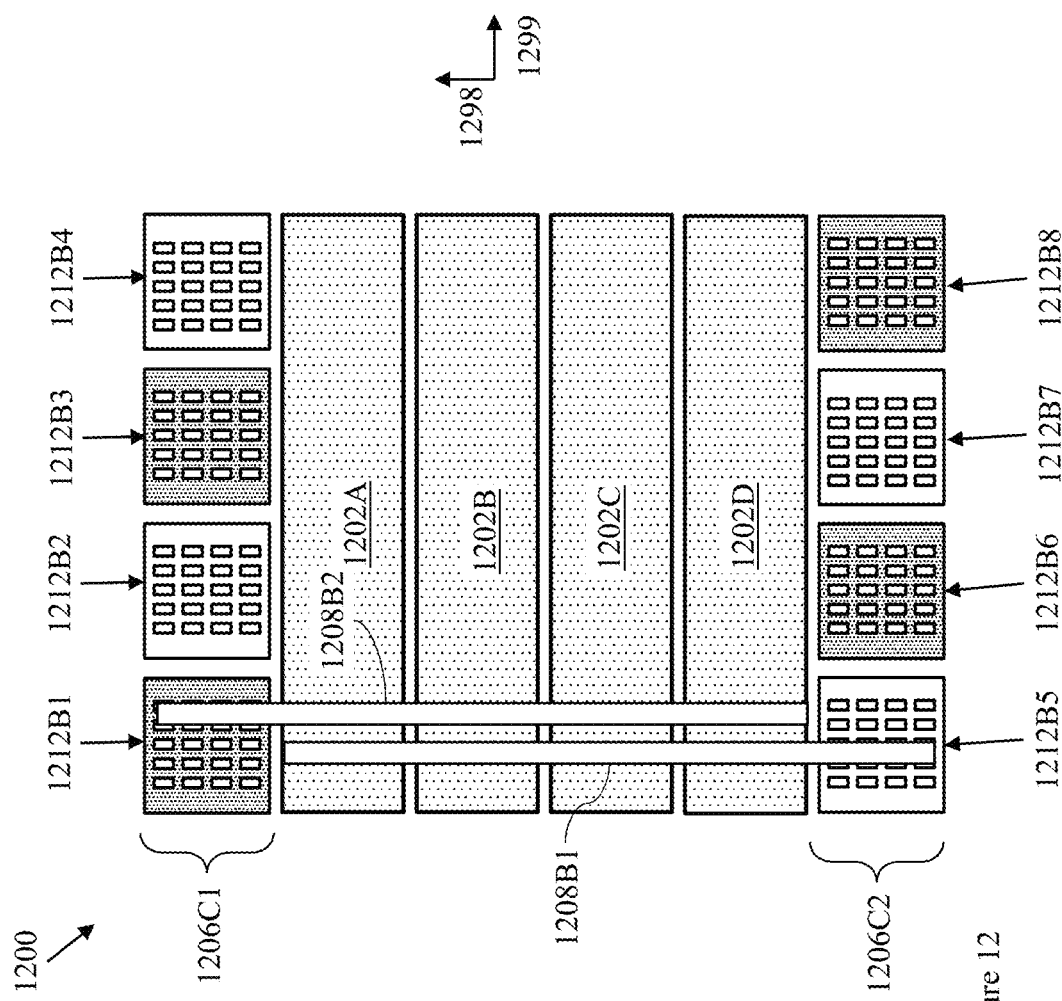
FIG. 12 is a top view of a semiconductor device layouts, in accordance with some embodiments.

FIG. 12 is a top view of a semiconductor device layout 1200, in accordance with some embodiments. In semiconductor device layout 1200, power cells in power columns at opposite sides of circuit areas 1202A, 1202B, 1202C, and 1202D, are electrically connected to different voltage sources. In some embodiments, the pattern of connections to voltage sources is an alternating pattern along power cells of a power column. In some embodiments, the pattern of connections to voltage sources of power cells of a power column, at a first side of a circuit area, is offset from the pattern of connections to voltage sources at the second side of the circuit area (e.g., opposite from the first side of the circuit area).

In semiconductor device layout 1200, circuit areas 1202A, 1202B, 1202C, and 1202D adjoin each other, and are bounded at opposite sides (e.g., a top side of circuit areas 1202A, and a bottom side of circuit area 1202D), by power cells of a power column. Power column 1206C1 adjoins a top side of circuit area 1202A, and power column 1206C2 adjoins a bottom side of circuit area 1202D. Circuit areas 1202B and 1202C are between circuit areas 1202A and 1202D along the direction 1298, and do not adjoin (along the direction 1298) a power cell.

Power cells in power column 1206C1 have alternating connections to voltage sources, as follows: power cell 1212B1 and power cell 1212B3 are electrically connected to a first voltage source, and power cell 1212B2 and power cell 1212B4 are electrically connected to a second voltage source. Power cell 1212B2 is between power cell 1212B1 and power cell 1212B2 along the direction 1199. Power cell 1212B3 is between power cell 1212B2 and power cell 1212B4 along the direction 1199. Power cell 1212B5 and power cell 1212B7 are electrically connected to the second voltage source, and power cell 1212B6 and power cell 1212B8 are electrically connected to the first voltage source. Power cell 1212B6 is between power cell 1212B5 and power cell 1212B7 along the direction 1199. Power cell 1212B7 is between power cell 1212B6 and power cell 1212B8 along the direction 1199.

Conductive rail 1208B1 electrically connects to power pillars of power cell 1212B5 and to circuit elements (not shown) of circuit areas 1202A, 1202B, 1202C, and 1202D. In some embodiments, the conductive rail connects to some, but not all, circuit areas between power cells of a power column. Conductive rail 1208B2 electrically connects to power pillars in power cell 1212B1, and to circuit elements in circuit areas 1202A, 1202B, 1202C, and 1202D. In some embodiments, the conductive rails connected to circuit areas at opposite sides of circuit areas electrically connect to the same circuit elements in the circuit areas. In some embodiments, the conductive rails connected to circuit areas at opposite sides of circuit areas electrically connect to different circuit elements in the circuit areas.

Figure 13:
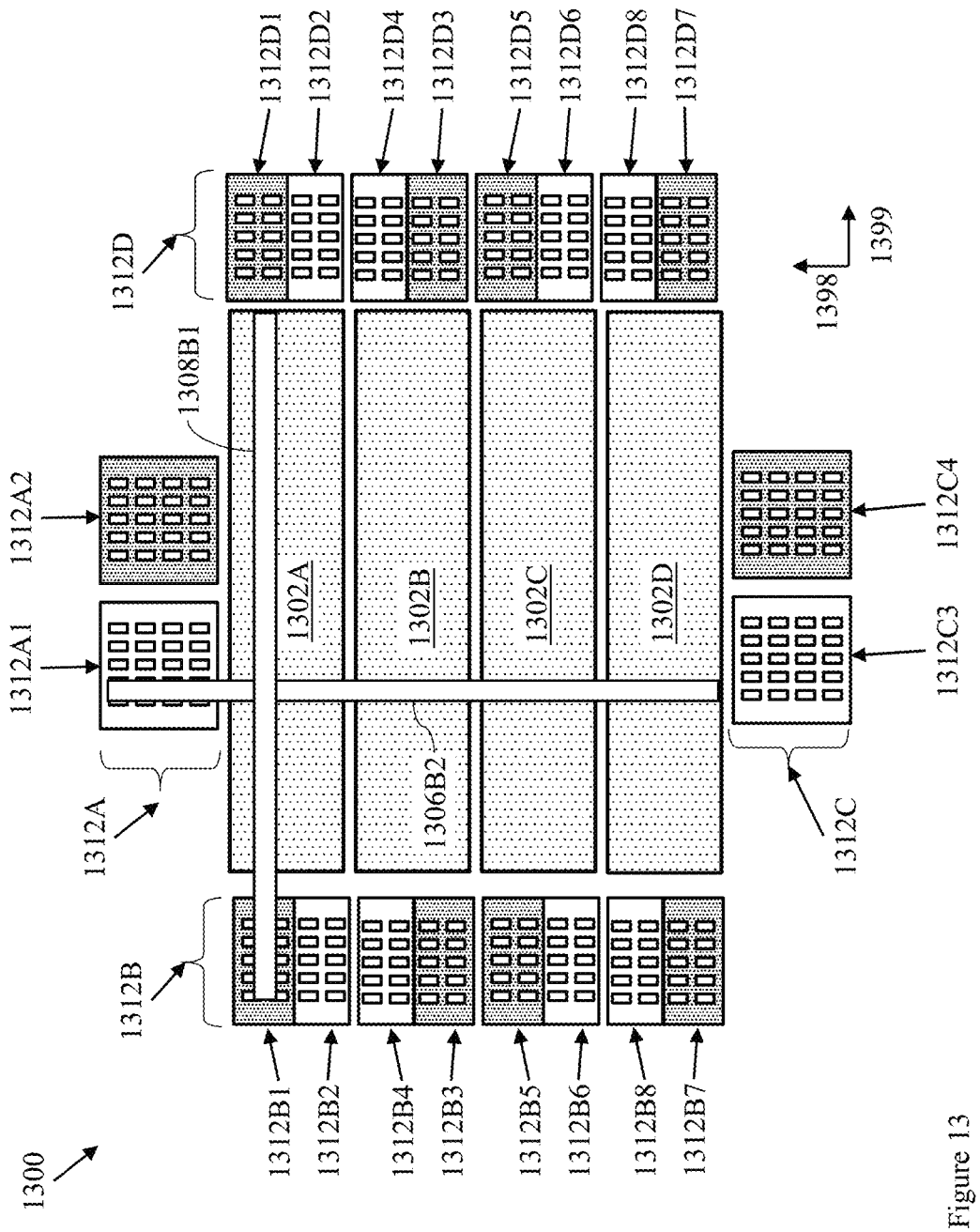
FIG. 13 is a top view of a semiconductor device layouts, in accordance with some embodiments.

FIG. 13 is a top view of a semiconductor device layout 1300, in accordance with some embodiments. Semiconductor device layout 1300 is a hybrid device layout, having elements of both semiconductor device layout 900 (power cells with electrical connections to a same voltage source directly opposite from each other across circuit areas), and semiconductor device layout 1100 (split power rows, or split power cells, directly opposite each other across the circuit areas).

Circuit areas 1302A, 1302B, 1302C, and 1302D, are surrounded on four sides by power cells. Circuit area 1302B is between circuit area 1302A and circuit area 1302C. Circuit area 1302C is between circuit area 1302B and circuit area 1302D. Power row 1312B and power row 1312D are at opposite sides of the circuit areas 1302A, 1302B, 1302C, and 1302D along the direction 1399. Power column 1312A and power column 1312C are at opposite sides of the circuit areas 1302A, 1302B, 1302C, and 1302D along the direction 1398. In some embodiments, conductive rails electrically connected to power cells, or power rows, or power subrows, cross at different levels of the semiconductor device layout. In semiconductor device layout 1300, conductive rail 1308B1 is electrically connected to power subrow 1312B1 and extends over circuit area 1302A. Conductive rail 1308B2 is electrically connected to power cells in power cell 1312A and extends over circuit areas 1302A, 1302B, 1302C, and 1302D. Conductive rail 1308B1 crosses over circuit area 1302A at a different level of the semiconductor device layout than the level where conductive rail 1308B2 crosses circuit area 1302.

Power cells directly opposite each other across the circuit areas 1302A, 1302B, 1302C, and 1302D are electrically connected to a same voltage source (either a supply voltage (Vdd) or ground (Vss)). Power subrows directly opposite each other across a circuit area are electrically connected to a same voltage source (either a supply voltage (Vdd) or ground (Vss)). Thus:

Power subrow 1312B1 is directly opposite from power subrow 1312D1 over circuit area 1302A, and power subrow 1312B1 and power subrow 1312D1 are electrically connected to the first voltage source; power subrow 1312B2 is directly opposite from power subrow 1312D2 over circuit area 1302A and power subrow 1312B2 and power subrow 1312D2 are electrically connected to the second voltage source.

Power subrow 1312B3 is directly opposite from power subrow 1312D3 over circuit area 1302B, and power subrow 1312B3 and power subrow 1312D3 are electrically connected to the first voltage source; and power subrow 1312B4 is directly opposite from power subrow 1312D4 over circuit area 1302B, and power subrow 1312B4 and power subrow 1312D4 are electrically connected to the second voltage source.

Power subrow 1312B5 is directly opposite from power subrow 1312D5 over circuit area 1302C, and power subrow 1312B5 and power subrow 1312D5 are electrically connected to the first voltage source; and power subrow 1312B6 is directly opposite from power subrow 1312D6 over circuit area 1302C, and power subrow 1312B6 and power subrow 1312D6 are electrically connected to the second voltage source.

Power subrow 1312B7 is directly opposite from power subrow 1312D7 over circuit area 1302D, and power subrow 1312B7 and power subrow 1312D7 are electrically connected to the first voltage source; and power subrow 1312B8 is directly opposite from power subrow 1312D8 over circuit area 1302D, and power subrow 1312B8 and power subrow 1312D8 are electrically connected to the second voltage source.

Conductive rails (not shown) electrically connect power cells and power subrows to circuit elements (not shown) in the circuit areas 1302A, 1302B, 1302C, and 1302D. Conductive rails which are electrically connected to power cells at opposite sides of the circuit areas 1302A, 1302B, 1302C, and 1302D along the direction 1399 are in a same level of the semiconductor device above the circuit areas. Conductive rails which are electrically connected to split power cells, or power subrows, at opposite sides of the circuit areas 1302A, 1302B, 1302C, and 1302D along the direction 1398 are in a same level of the semiconductor device above the circuit areas.

Figure 14:
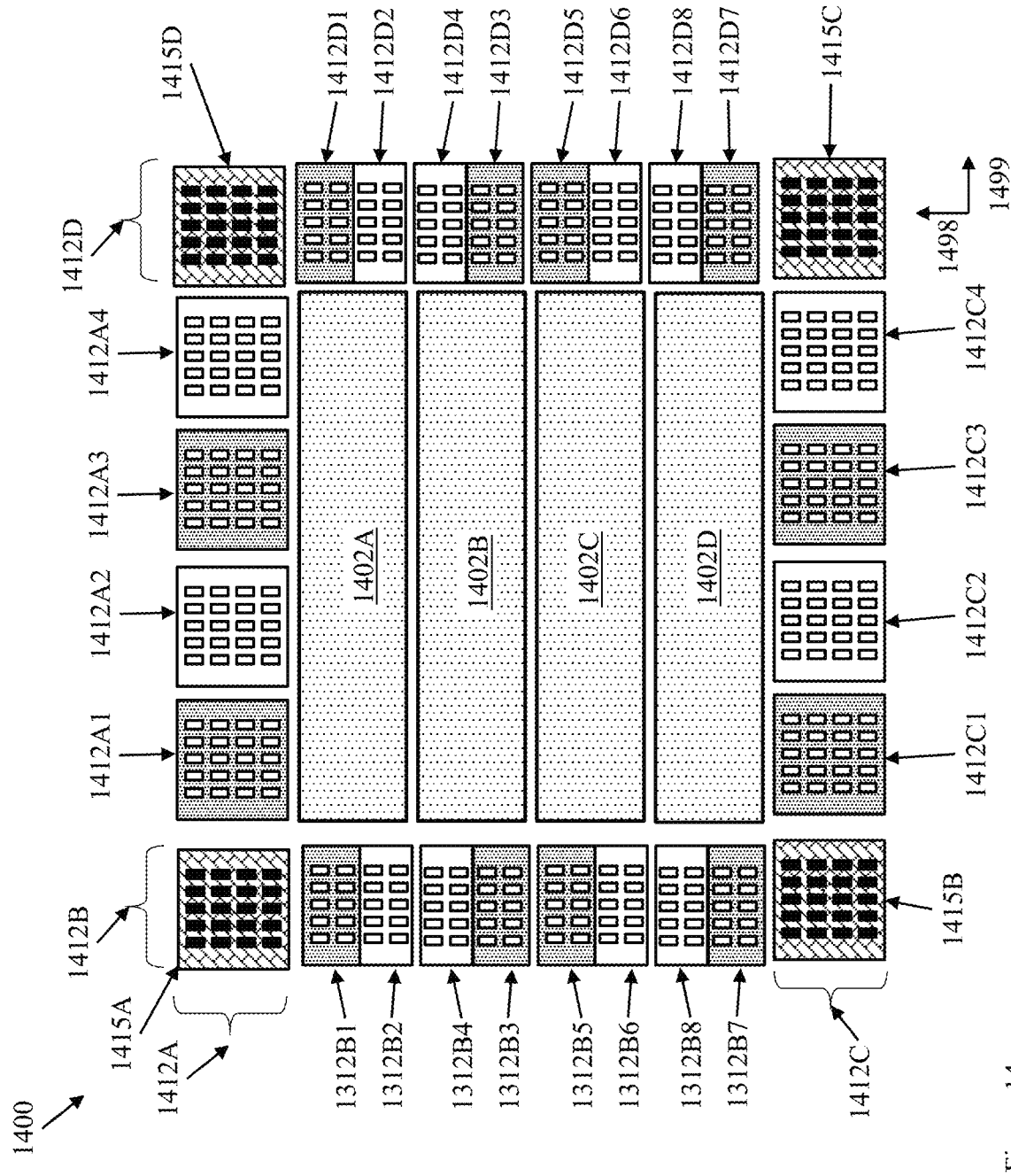
FIG. 14 is a top view of a semiconductor device layouts, in accordance with some embodiments.

FIG. 14 is a top view of a semiconductor device layout 1400, in accordance with some embodiments. Semiconductor device layout 1400 is a hybrid device layout, having elements of both semiconductor device layout 900 (power cells with electrical connections to a same voltage source directly opposite from each other across circuit areas), and semiconductor device layout 1100 (split power rows, or split power cells, directly opposite each other across the circuit areas).

In semiconductor device layout 1400, features which have a same structure and function as described above in semiconductor device layout 1300 have a same identifying numeral, incremented by 100.

In semiconductor device layout 1400, power cells 1412A1 and 1412A2 are electrically connected to a first voltage source, and power cells 1412A2 and 1412A4 are electrically connected to a second voltage source. Power cell 1412A2 is between power cell 1412A1 and power cell 1412A3. Power cell 1412A3 is between power cell 1412A2 and power cell 1412A4.

Power cells 1412C1 and 1412C2 are electrically connected to a first voltage source, and power cells 1412C2 and 1412C4 are electrically connected to a second voltage source. Power cell 1412C2 is between power cell 1412C1 and power cell 1412C3. Power cell 1412C3 is between power cell 1412C2 and power cell 1412C4. Power cell 1412C1 is directly opposite from power cell 1412A1 across circuit areas 1402A, 1402B, 1402C, and 1402D. Similarly, power cell 1412C2 is directly opposite from power cell 1412A2, power cell 1412C3 is directly opposite from power cell 1412A3, and power cell 1412C4 is directly opposite from power cell 1412A4.

A dummy cell is a structure which includes conductive pillars and/or power pillars and is included in a semiconductor device layout in order to maintain or improve uniformity of a manufacturing process for the semiconductor device. By including dummy cells, as described below, in the semiconductor device layout 1400, the etch uniformity for making conductive pillars, or power pillars.

Dummy cells (or, dummy regions) 1415A and 1415D, are at ends of power cell 1412A, along the direction 1499. Dummy cells 1415B and 1415C are at end of power cell 1412C along the direction 1499. Dummy cells 1415B and 1415C are at opposite sides of power row 1412B, and dummy cells 1415C and 1415D are at opposite sides of power row 1412D. In the dummy cells, or dummy regions, power pillars are formed which are electrically isolated from the semiconductor device. In some embodiments, the dummy cell power pillars are electrically isolated from the conductive rails over the circuit area. In some embodiments, the dummy cell power pillars are electrically isolated from the conductive rails below the bottom of the substrate (e.g., the conductive rails which electrically connect to a voltage source (a supply voltage (Vdd), or ground (Vss)). In some embodiments, dummy cells are located at corners of a circuit area in a semiconductor device layout. In some embodiments, dummy cells are located along edges of a circuit area between power cells of power rows or power columns, or power subrows, of the semiconductor device layout, to provide pattern uniformity during etch processes, without adding parasitic capacitance FIG. 15 is a block diagram of a semiconductor device 1500 in accordance with at least one embodiment of the present disclosure.

Figure 15:
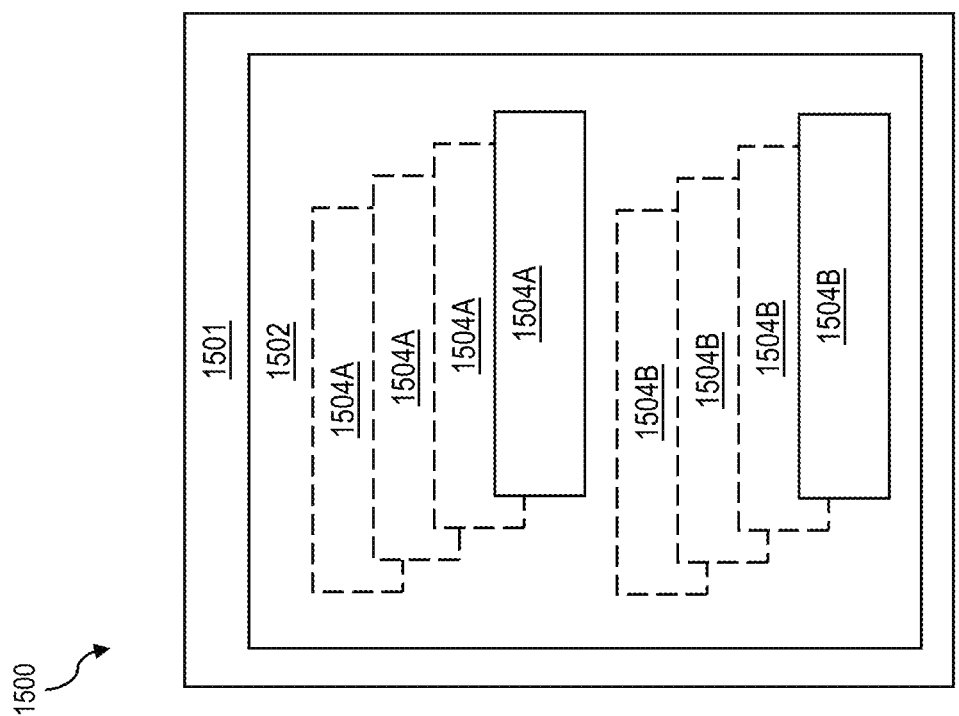
FIG. 15 is a block diagram of a semiconductor device in accordance with some embodiments.

In FIG. 15, semiconductor device 1500 includes, among other things, a substrate 1501 having thereon a circuit macro (hereinafter, macro) 1502. In some embodiments, macro 1502 is an SRAM macro. In some embodiments, macro 1502 is a macro other than an SRAM macro. Macro 1502 includes, among other things, a wire routing arrangement 1504. Example of layout diagrams resulting in wire routing arrangement 1504 include the routing arrangement layout diagrams in each of each of FIGS. 5-14.

Figure 16:
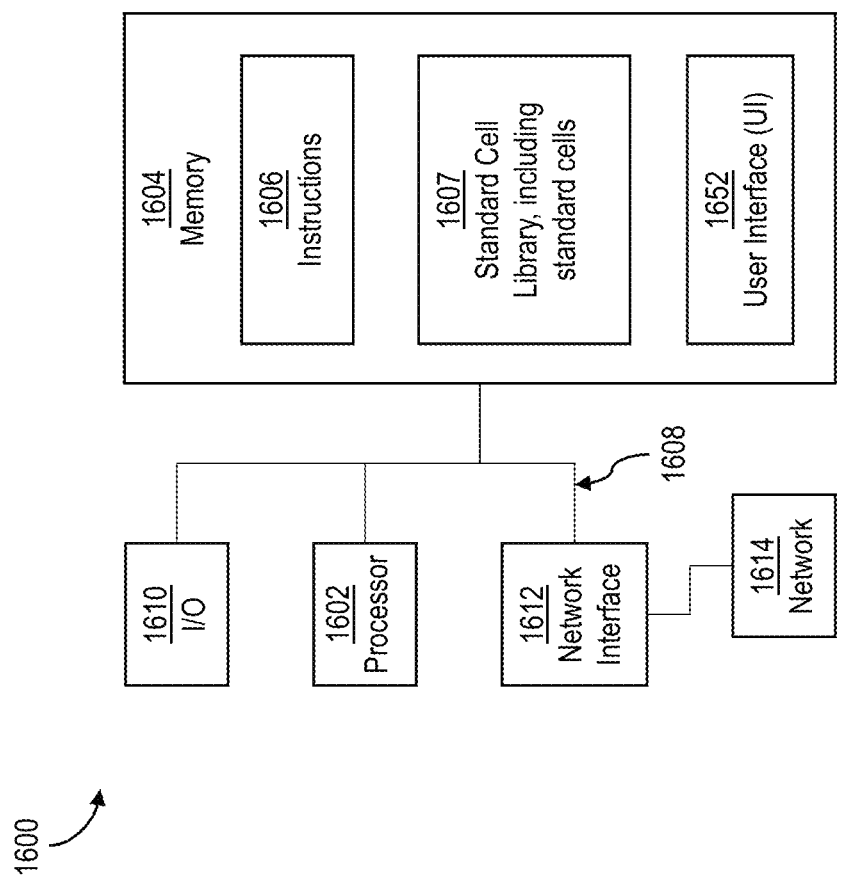
FIG. 16 is a block diagram of an electronic design automation (EDA) system, in accordance with some embodiments.

FIG. 16 is a block diagram of an electronic design automation (EDA) system 1600 in accordance with some embodiments.

In some embodiments, EDA system 1600 is a general purpose computing device including a hardware processor 1602 and a non-transitory, computer-readable storage medium (storage medium) 1604. Computer-readable storage medium 1604, amongst other things, is encoded with (i.e., stores) computer program code, i.e., a set of computer-executable instructions (instructions). Execution of computer-executable instructions 1606 by hardware processor 1602 represents (at least in part) an EDA tool which implements a portion or all of, e.g., the methods described herein in accordance with one or more (hereinafter, the noted processes and/or methods).

Hardware processor 1602 is electrically coupled to computer-readable storage medium 1604 via a bus 1608. Hardware processor 1602 is also electrically coupled to an I/O interface 1610 by bus 1608. A network interface 1612 is also electrically connected to hardware processor 1602 via bus 1608. Network interface 1612 is connected to a network 1614, so that hardware processor 1602 and computer-readable storage medium 1604 are capable of connecting to external elements via network 1614. Hardware processor 1602 is configured to execute computer program code 1606 encoded in computer-readable storage medium 1604 in order to cause EDA system 1600 to be usable for performing a portion or all of the noted processes and/or methods. In one or more embodiments, hardware processor 1602 is a central processing unit (CPU), a multi-processor, a distributed processing system, an application specific integrated circuit (ASIC), and/or a suitable processing unit.

In one or more embodiments, computer-readable storage medium 1604 is an electronic, magnetic, optical, electromagnetic, infrared, and/or a semiconductor system (or apparatus or device). For example, computer-readable storage medium 1604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1604 includes a compact disk-read only memory (CD-ROM), a compact disk-read/write (CD-R/W), and/or a digital video disc (DVD).

In one or more embodiments, storage medium 1604 stores computer program code 1606 configured to cause EDA system 1600 (where such execution represents (at least in part) the EDA tool) to be usable for performing a portion or all of the noted processes and/or methods. In one or more embodiments, storage medium 1604 also stores information which facilitates performing a portion or all of the noted processes and/or methods. In one or more embodiments, storage medium 1604 stores a library 1607 of standard cells including such standard cells as disclosed herein.

EDA system 1600 includes I/O interface 1610. I/O interface 1610 is coupled to external circuitry. In one or more embodiments, I/O interface 1610 includes a keyboard, keypad, mouse, trackball, trackpad, touchscreen, and/or cursor direction keys for communicating information and commands to hardware processor 1602.

EDA system 1600 also includes network interface 1612 coupled to hardware processor 1602. Network interface 1612 allows EDA system 1600 to communicate with network 1614, to which one or more other computer systems are connected. Network interface 1612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 1600.

EDA system 1600 is configured to receive information through I/O interface 1610. The information received through I/O interface 1610 includes one or more of instructions, data, design rules, libraries of standard cells, and/or other parameters for processing by hardware processor 1602. The information is transferred to hardware processor 1602 via bus 1608. EDA system 1600 is configured to receive information related to a UI through I/O interface 1610. The information is stored in computer-readable medium 1604 as user interface (UI) 1652.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1600. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 17:
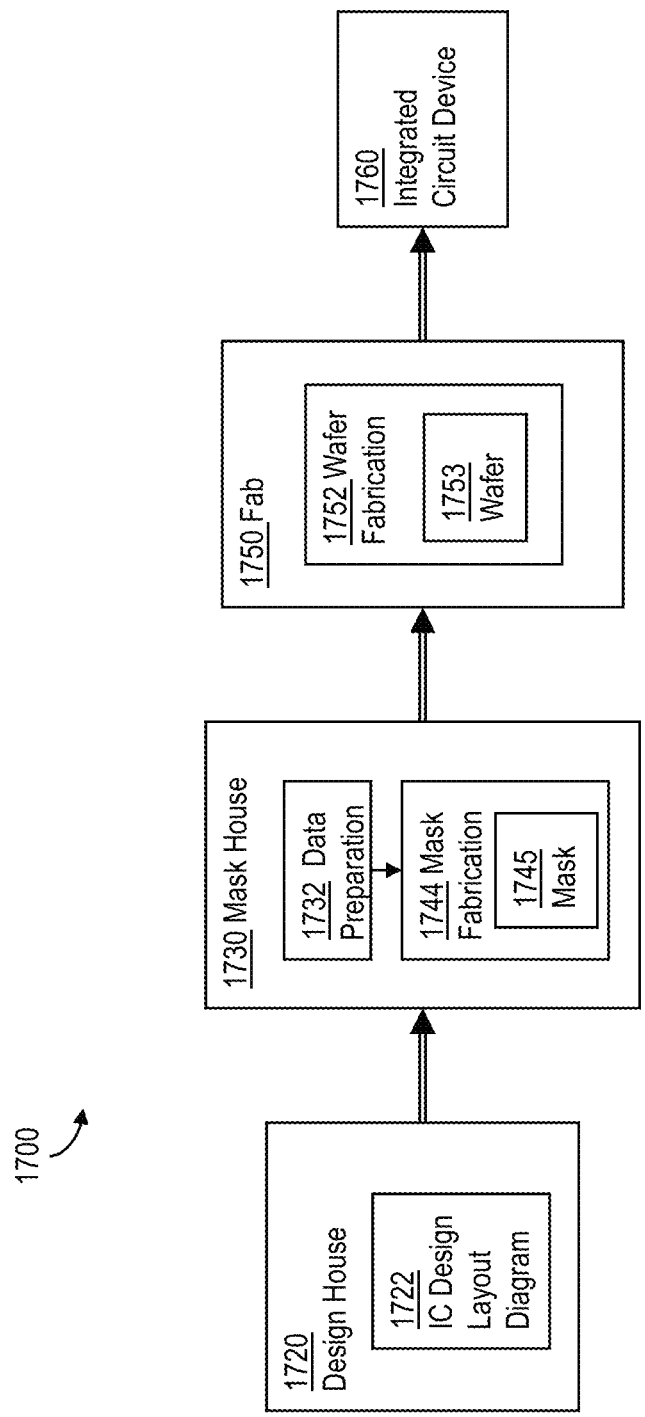
FIG. 17 is a block diagram of an integrated circuit (IC) manufacturing system, and an IC manufacturing flow associated therewith, in accordance with some embodiments.

FIG. 17 is a block diagram of an integrated circuit (IC) manufacturing system 1700, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1700.

In FIG. 17, IC manufacturing system 1700 includes entities, such as a design house 1720, a mask house 1730, and an IC manufacturer/fabricator ("fab") 1750, that interact with one another in the design, development, and manufacturing cycles and/or services related to manufacturing an IC device 1760. The entities in IC manufacturing system 1700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1720, mask house 1730, and IC fab 1750 is owned by a single larger company. In some embodiments, two or more of design house 1720, mask house 1730, and IC fab 1750 coexist in a common facility and use common resources.

Design house 1720 (or, a design team) generates an IC design layout diagram 1722. IC design layout diagram 1722 includes various geometrical patterns designed for an IC device 1760. The geometrical patterns correspond to patterns of metal, oxide, or semiconductor layers that make up the various components of IC device 1760 to be fabricated. The various layers combine to form various IC features. For example, a portion of IC design layout diagram 1722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1720 implements a proper design procedure to manufacture IC design layout diagram 1722. The design procedure includes one or more of logic design, physical design or place and route. IC design layout diagram 1722 is presented in one or more data files having information of the geometrical patterns. For example, IC design layout diagram 1722 can be expressed in a GDSII file format or DFII file format.

Mask house 1730 includes mask data preparation 1732 and mask fabrication 1744. Mask house 1730 uses IC design layout diagram 1722 to manufacture one or more masks 1745 to be used for fabricating the various layers of IC device 1760 according to IC design layout diagram 1722. Mask house 1730 performs mask data preparation 1732, where IC design layout diagram 1722 is translated into a representative data file ("RDF"). Mask data preparation 1732 provides the RDF for mask fabrication 1744. Mask fabrication 1744 includes a mask writer. A mask writer converts the RDF to an image on a substrate, such as a mask 1745 or a semiconductor wafer 1753. The IC design layout design layout diagram 1722 is manipulated by mask data preparation 1732 to comply with particular characteristics of the mask writer and/or requirements of IC fab 1750. In FIG. 17, mask data preparation 1732 and mask fabrication 1744 are illustrated as separate elements. In some embodiments, mask data preparation 1732 and mask fabrication 1744 can be collectively referred to as mask data preparation.

In some embodiments, mask data preparation 1732 includes optical proximity correction (OPC) which uses lithography enhancement techniques to compensate for image errors, such as those that can arise from diffraction, interference, other process effects and the like. OPC adjusts IC design layout diagram 1722. In some embodiments, mask data preparation 1732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1732 includes a mask rule checker (MRC) that checks the IC design layout diagram 1722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1722 to compensate for limitations during mask fabrication 1744, which may undo part of the modifications performed by OPC in order to meet mask creation rules.

In some embodiments, mask data preparation 1732 includes lithography process checking (LPC) that simulates processing that will be implemented by IC fab 1750 to fabricate IC device 1760. LPC simulates this processing based on IC design layout diagram 1722 to create a simulated manufactured device, such as IC device 1760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1722.

It should be understood that the above description of mask data preparation 1732 has been simplified for the purposes of clarity. In some embodiments, mask data preparation 1732 includes additional features such as a logic operation (LOP) to modify the IC design layout diagram 1722 according to manufacturing rules. Additionally, the processes applied to IC design layout diagram 1722 during mask data preparation 1732 may be executed in a variety of different orders.

After mask data preparation 1732 and during mask fabrication 1744, a mask 1745 (or photomask, or reticle), or a group of masks 1745, are fabricated based on the modified IC design layout diagram 1722. In some embodiments, mask fabrication 1744 includes performing one or more lithographic exposures based on IC design layout diagram 1722. In some embodiments, an electron-beam (e-beam) or a mechanism of multiple e-beams is used to form a pattern on a mask 1745 based on the modified IC design layout diagram 1722. Mask 1745 can be formed in various technologies. In some embodiments, mask 1745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1745 includes a transparent substrate (e.g., fused quartz) and an opaque material (e.g., chromium) coated in the opaque regions of the binary mask. In another example, mask 1745 is formed using a phase shift technology. In a phase shift mask (PSM) version of mask 1745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1744 is used in a variety of processes. For example, such a mask(s) is used in an ion implantation process to form various doped regions in semiconductor wafer 1753, in an etching process to form various etching regions in semiconductor wafer 1753, and/or in other suitable processes.

IC fab 1750 includes wafer fabrication 1752. IC fab 1750 is an IC fabrication business that includes one or more manufacturing facilities for the fabrication of a variety of different IC products. In some embodiments, IC fab 1750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1750 uses mask(s) 1745 fabricated by mask house 1730 to fabricate IC device 1760. Thus, IC fab 1750 at least indirectly uses IC design layout diagram 1722 to fabricate IC device 1760. In some embodiments, semiconductor wafer 1753 is fabricated by IC fab 1750 using mask(s) 1745 to manufacture IC device 1760. In some embodiments, the IC fabrication includes performing one or more lithographic exposures based at least indirectly on IC design layout diagram 1722. Semiconductor wafer 1753 includes a silicon substrate or other proper substrate having material layers formed thereon. Semiconductor wafer 1753 further includes one or more of various doped regions, dielectric features, multilevel interconnects, and the like (formed at subsequent manufacturing steps).

Details regarding an integrated circuit (IC) manufacturing system (e.g., manufacturing system 1700 of FIG. 17), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

An aspect of this description relates to a device including an electrical circuit having a first set of circuit elements. The device further includes a first set of conductive pillars over a first side of a substrate. The device further includes a first conductive rail electrically connected to each of the first set of conductive pillars, wherein each of the first set of conductive pillars is electrically connected to each of the first set of circuit elements by the first conductive rail. The device further includes a first plurality of power pillars extending through the substrate, wherein each of the first plurality of power pillars is electrically connected to the first conductive rail. In some embodiments, at least one of the first conductive pillars comprises a conductive line and a conductive via. In some embodiments, the device further includes a second set of conductive pillars on a second side of the substrate, wherein the second side of the substrate is opposite the first side of the substrate. In some embodiments, at least one of the second set of conductive pillars is integral with at least one of the first plurality of power pillars. In some embodiments, each of the second set of conductive pillars is electrically connected to a corresponding power pillar of the plurality of power pillars. In some embodiments, the device further includes a second conductive rail electrically connected to each of the second set of conductive pillars. In some embodiments, the device further includes a second plurality of power pillars extending through the substrate. In some embodiments, the second plurality of power pillars is on an opposite side of the electrical circuit from the first plurality of power pillars. In some embodiments, each of the second plurality of power pillars is electrically connected to a second conductive rail on a same side of the substrate as the first conductive rail. In some embodiments, the second conductive rail is parallel to the first conductive rail.

An aspect of this description relates to a device including an electrical circuit. The device further includes a first plurality of power pillars extending through the substrate, wherein the first plurality of power pillars is on a first side of the electrical circuit. The device further includes a first conductive rail electrically connected to the electrical circuit, wherein the first conductive rail extends in a first direction parallel to a top surface of the substrate, and each of the first plurality of power pillars is electrically connected to the first conductive rail. The device further includes a second plurality of power pillars extending through the substrate, wherein the second plurality of power pillars is on a second side of the electrical circuit. The device further includes a second conductive rail electrically connected to the electrical circuit, wherein the second conductive rail extends in a second direction parallel to the top surface of the substrate, and each of the second plurality of power pillars is electrically connected to the second conductive rail. In some embodiments, the first direction is parallel to the second direction. In some embodiments, the first direction is perpendicular to the second direction. In some embodiments, the first side of the electrical circuit is opposite the second side of the electrical circuit. In some embodiments, the first conductive rail is on a same side of the substrate as the second conductive rail. In some embodiments, the first conductive rail is on an opposite side of the substrate from the second conductive rail.

An aspect of this description relates to a method including forming an electrical circuit on a first side of a substrate. The method further includes electrically connecting the electrical circuit to a first conductive rail. The method further includes forming a first plurality of power pillars extending through the substrate, wherein the first plurality of power pillars is separated from the electrical circuit in a direction parallel to a top surface of the substrate. The method further includes electrically connecting each of the first plurality of power pillars to the first conductive rail. The method further includes electrically connecting each of the plurality of power pillars to a second conductive rail on an opposite side of the substrate from the first conductive rail. In some embodiments, the method further includes a second plurality of power pillars on an opposite side of the electrical circuit from the first plurality of power pillars. In some embodiments, the method further includes electrically connecting the second plurality of power pillars to a third conductive rail. In some embodiments, the method further includes electrically connecting the third conductive rail to the electrical circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device, comprising:
an electrical circuit having a first set of circuit elements;
a first set of conductive pillars over a first side of a substrate;
a first conductive rail electrically connected to each of the first set of conductive pillars, wherein each of the first set of conductive pillars is electrically connected to each of the first set of circuit elements by the first conductive rail; and a first plurality of power pillars extending through the substrate, wherein each of the first plurality of power pillars is electrically connected to the first conductive rail.

2. The device of claim 1, wherein at least one of the first conductive pillars comprises a conductive line and a conductive via.

3. The device of claim 1, further comprising a second set of conductive pillars on a second side of the substrate, wherein the second side of the substrate is opposite the first side of the substrate.

4. The device of claim 3, wherein at least one of the second set of conductive pillars is integral with at least one of the first plurality of power pillars.

5. The device of claim 3, wherein each of the second set of conductive pillars is electrically connected to a corresponding power pillar of the plurality of power pillars.

6. The device of claim 5, further comprising a second conductive rail electrically connected to each of the second set of conductive pillars.

7. The device of claim 1, further comprising a second plurality of power pillars extending through the substrate.

8. The device of claim 7, wherein the second plurality of power pillars is on an opposite side of the electrical circuit from the first plurality of power pillars.

9. The device of claim 7, wherein each of the second plurality of power pillars is electrically connected to a second conductive rail on a same side of the substrate as the first conductive rail.

10. The device of claim 9, wherein the second conductive rail is parallel to the first conductive rail.

11. A device, comprising:
an electrical circuit;
a first plurality of power pillars extending through the substrate, wherein the first plurality of power pillars is on a first side of the electrical circuit;
a first conductive rail electrically connected to the electrical circuit, wherein the first conductive rail extends in a first direction parallel to a top surface of the substrate, and each of the first plurality of power pillars is electrically connected to the first conductive rail;
a second plurality of power pillars extending through the substrate, wherein the second plurality of power pillars is on a second side of the electrical circuit; and
a second conductive rail electrically connected to the electrical circuit, wherein the second conductive rail extends in a second direction parallel to the top surface of the substrate, and each of the second plurality of power pillars is electrically connected to the second conductive rail.

12. The device of claim 11, wherein the first direction is parallel to the second direction.

13. The device of claim 11, wherein the first direction is perpendicular to the second direction.

14. The device of claim 11, wherein the first side of the electrical circuit is opposite the second side of the electrical circuit.

15. The device of claim 11, wherein the first conductive rail is on a same side of the substrate as the second conductive rail.

16. The device of claim 11, wherein the first conductive rail is on an opposite side of the substrate from the second conductive rail.

17. A method comprising:
forming an electrical circuit on a first side of a substrate;
electrically connecting the electrical circuit to a first conductive rail;
forming a first plurality of power pillars extending through the substrate, wherein the first plurality of power pillars is separated from the electrical circuit in a direction parallel to a top surface of the substrate;
electrically connecting each of the first plurality of power pillars to the first conductive rail; and
electrically connecting each of the plurality of power pillars to a second conductive rail on an opposite side of the substrate from the first conductive rail.

18. The method of claim 17, further comprising a second plurality of power pillars on an opposite side of the electrical circuit from the first plurality of power pillars.

19. The method of claim 18, further comprising electrically connecting the second plurality of power pillars to a third conductive rail.

20. The method of claim 19, further comprising electrically connecting the third conductive rail to the electrical circuit.

* * * * *